(12) United States Patent
Pascucci et al.

(10) Patent No.: US 7,274,594 B2
(45) Date of Patent: Sep. 25, 2007

(54) NON-VOLATILE MEMORY ELECTRONIC DEVICE WITH NAND STRUCTURE BEING MONOLITHICALLY INTEGRATED ON SEMICONDUCTOR

(75) Inventors: Luigi Pascucci, Sesto San Giovanni (IT); Paolo Rolandi, Voghera (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/279,378

(22) Filed: Apr. 11, 2006

(65) Prior Publication Data

US 2006/0227609 A1    Oct. 12, 2006

(30) Foreign Application Priority Data

| Apr. 11, 2005 | (EP) | ................................... 05425207 |
| Apr. 11, 2005 | (EP) | ................................... 05425209 |
| Apr. 11, 2005 | (IT) | ............................. MI05A0609 |
| Apr. 11, 2005 | (IT) | ............................. MI05A0610 |

(51) Int. Cl.
*G11C 16/04* (2006.01)

(52) U.S. Cl. ............................. 365/185.11; 365/185.12; 365/189.05

(58) Field of Classification Search ........... 365/185.11, 365/185.12, 185.33, 189.05, 185.14, 185.28
See application file for complete search history.

(56) References Cited

U.S. PATENT DOCUMENTS

| 5,732,018 | A | | 3/1998 | Choi et al. ............. 365/185.17 |
| 5,986,933 | A | * | 11/1999 | Takeuchi et al. ........ 365/185.12 |
| 6,292,392 | B1 | * | 9/2001 | Fukui ..................... 365/185.11 |
| 6,512,703 | B2 | * | 1/2003 | Sakui et al. ........... 365/189.05 |

* cited by examiner

*Primary Examiner*—Gene N. Auduong
(74) *Attorney, Agent, or Firm*—Lisa K. Jorgenson; Allen, Dyer, Doppelt, Milbrath & Gilchrist, P.A.

(57) ABSTRACT

A non-volatile memory electronic device is integrated on a semiconductor with an architecture including at least one memory matrix organized in rows or word lines and columns or bit lines of memory cells. The matrix is divided into at least a first and a second memory portions having a different access speed. The first and second memory portions may share the structures of the bit lines which correspond to one another and one by one and are electrically interrupted by controlled switches placed between the first and the second portions.

33 Claims, 27 Drawing Sheets

TAB_1 CONVENTIONAL_&_WIRED NAND_FLASH BIAS_OPERATIONS

| | | CONVENTIONAL NAND_FLASH | | | TWO SSL_WIRED NAND_FLASH | | | TWO WIRED SSL&wl NAND_FLASH | | |
|---|---|---|---|---|---|---|---|---|---|---|
| | | READ | PROG | ERASE SECTOR:(i-j) | READ | PROG | ERASE SECTOR:(i-j) | READ | PROG | ERASE SECTOR:(i&j) |
| | | CELL CONTENT | CELL PATTERN | | CELL CONTENT | CELL PATTERN | | CELL CONTENT | CELL PATTERN | |
| PASS GATE_i | BI: ACTIVE | 10 | 20 | Vcc | 10 | 20 | Vcc | 10 | 20 | Vcc |
| DSL_i | | V_reg | Vcc | F | V_reg | Vcc | F | V_reg | Vcc | F |
| ROW_i | ROW: ACTIVE | 0 | 18 | 0 | 0 | 18 | 0 | 0 | 18 | 0 |
| | ROW: NO_ACTIVE | V-reg | 10 | – | V-reg | 10 | – | V-reg | 10 | – |
| | ROW: NO_SEL | – | – | – | – | – | – | – | – | – |
| SSL_i | (i&j)PASS_G (*) | Vcc | 0 | F | *Vcc | *0 | *F | Vcc | 0 | F |
| PASS GATE_j | | 0 | 0 | 0 | 0 | 0 | F | F | (Vcc)0 | F |
| DSL_j | | F_0 | F_0 | F | F_0 | F_0 | F | F | 18 | F |
| ROW_j | ROW: ACTIVE | – | – | – | – | – | – | – | 10 | – |
| | ROW: NO_ACTIVE | F_0 | 0 | F | F_0 | F_0 | F | V_reg | 0 | – |
| | ROW: NO_SEL | 0 | 0 | 0 | *V_Reg | *0 | *F | V_reg | 0 | F |
| SSL_j | (i&j)PASS_G (*) | | | | | | | | | |
| WELL | | 0 | 0 | 20 | 0 | 0 | 20 | 0 | 0 | 20 |
| S_i-j | | 0 | 0 | F | 0 | 0 | F | 0 | 0 | F |

ARRAY BLOCK_i / ARRAY BLOCK_j

FIG. 9

4-Rank BORDER STRAP
(PREFERRED EMBODIMENT)

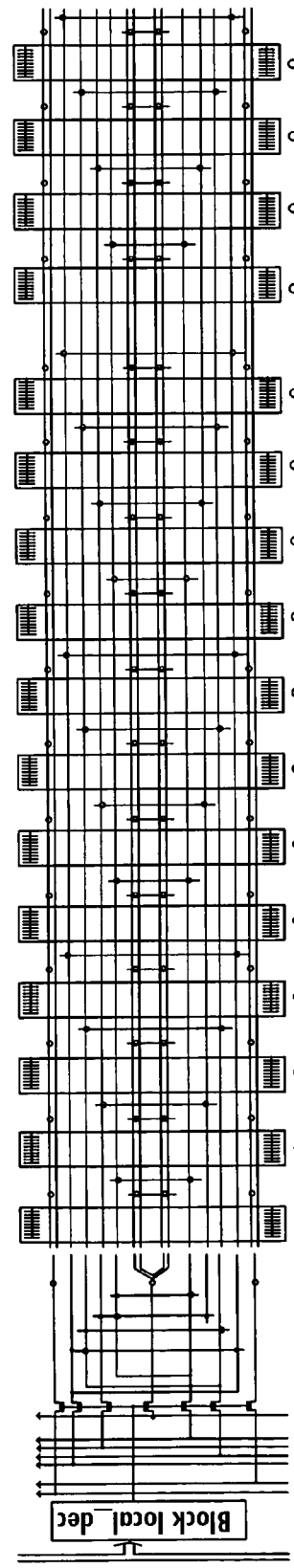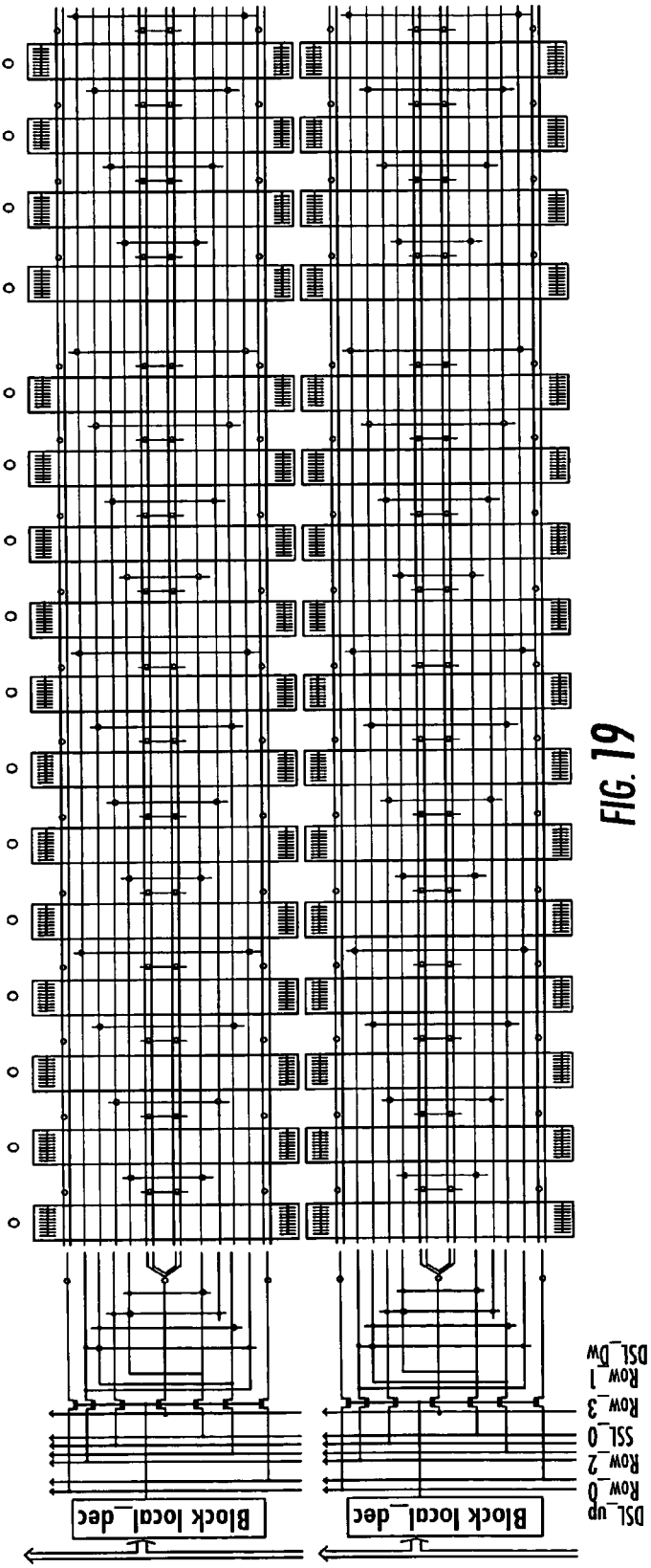
FIG. 20 BORDER & DISTRIBUTED MIDDLE_STRAP
FIG. 19

NON-VOLATILE MEMORY ELECTRONIC DEVICE WITH NAND STRUCTURE BEING MONOLITHICALLY INTEGRATED ON SEMICONDUCTOR

FIELD OF THE INVENTION

The present invention relates to a Flash EEPROM electronic memory device monolithically integrated on semiconductor and having a NAND architecture comprising at least one memory matrix organized in memory cell rows and columns. The invention also relates to a method for programming the above memory device with the NAND structure.

BACKGROUND OF THE INVENTION

It is known that the market for non-volatile memories, for example of the EEPROM or Flash EEPROM type, is currently growing significantly and the most promising applications relate to the "data storage" field. Until a few years ago, such a market almost exclusively involved the consumer field of digital cameras, with the associated memory cards, or the known USB keys which represented expansion mobile memories for personal computers. Therefore, the demand for these products by the consumer market was mainly addressed to flash memories of large capacity.

This trend seems to be destined to be reinforced in the next years by virtue of the newer and newer applications of portable electronic devices which require a higher and higher memory capacity, for example, for digital cameras or for mobile phones of the last generation operating, for example, according to the 3G or UMTS standard.

These applications are completely compatible with the natural evolution of Flash memories if one considers that such memories are substantially solid-state mass memory units with further advantages linked to their low power consumption, to their operation silence, and to their reduced space, etc.

As it is well known to the skilled person in the art, the Flash memory architectures are substantially referred to two fundamental paths, the first of which refers to the traditional and widely tested NOR architectures, whereas the second one refers to the more innovative and promising NAND architectures. For the previously cited applications the flash architecture being most suitable to the requirements of low consumption, high density, high program and/or erase speed, is certainly that of the NAND type. This kind of architecture exhibits advantages with respect to NOR architectures. In particular Flash memories with the NAND architecture are faster in the data storage activities and in managing large amounts of data to be restored in a synchronous way, and this makes them more suitable to the use for applications on portable electronic devices.

Since in the data storage applications the need of a random access time is less important with respect to the case of "code storage" applications, the most significant feature of the architectures of the NOR type loses most of its importance to the advantage of the NAND architecture which allows treating large amounts of "synchronous" data in reading and programming in a simple and quick way. However, although having the feature of a superior data modify speed, such NAND memories do not allow a fast random access to the same, since they are oriented to readings of entire pages of at least 512 bytes, but not of the single bytes. In fact, the NAND access protocol is quite slow in random access due to the known latency time, and it exhibits serious difficulties for acceding into a sector or a page in a random way.

For meeting the increasing needs of portable electronic devices it would be necessary to have in a same memory also an excellent random access time, such as to perform the code or the boot of the operative system or of the programs without the burdensome assistance of a RAM. Recently, further new needs have arisen linked to the game and cellular phone markets, which need the availability of high capacity memories, to store any kind of data, but also to store an operative system, video, programs, results etc.

To meet these needs the known technique has recently been proposed including devices defined as MCP (Multi Chip Package) which incorporate, in a single package, different integrated electronic circuits such as for example several types of memory circuits, for example one Flash memory of the NAND type, one of the NOR type, and one RAM memory.

All these memories are assembled and supplied in a single package so as to provide a single device simultaneously having the advantages of all the memories on the market, for example density and storage capability as regards to the NAND portion, or access speed and XIP possibility as regards to the NOR portion, and random access as regards the RAM portion.

One of these devices is commercially known with the acronym OneNAND and manufactured by Samsung. Another example of this kind of Multi Chip Package is the "DiskOnChip" of M-System.

Although advantageous under several aspects, these devices are not exempt from drawbacks. First of all it is to be considered that the various memory circuits to be assembled in a single package are realized with different technologies that oblige addressing problems of compatibility in the supplies on a single package and in the management of the input/output signals.

Secondly, the costs of the resulting package cannot differ significantly from the global cost of the various components, since they cannot exploit large scale economies in the realization of devices assembled with components being different from one another.

There exist, then, a series of problems to be faced starting from the assumption that only a detailed comprehension of the phenomena apt to the memorization of the data inside the memory cells can allow understanding of the intrinsic limits of the adopted technology.

For example, in the herewith attached FIG. 1 the structure is shown of a non-volatile memory device 1 integrated on a semiconductor and comprising a NAND memory matrix 2 of the traditional non-volatile type made of a plurality of blocks or physical sectors organized in cell rows and columns. This type of architecture provides a very organized structure of memory cells divided in two sub-matrixes 3 and 4, left L and right R, making reference to a single row decoding block 5 centrally arranged in the device 1. A bank of registers of the read amplifiers or sense amplifiers 6 and 7 corresponds to each sub-matrix L, R.

In FIG. 1A, by way of illustration only, the matrix 2 is shown with blocks i and j of only four rows, which, however, are practically made of at least 16 rows and four columns. Each row or word line ROW <0:3> of a given n-th block of the matrix corresponds to a respective row driver.

It can be also appreciated that the cells of a given block or sector i, j . . . have a common source line and they are connected to a respective bit line and to the common source line by way of respective drain (DSL) and source (SSL) selectors.

In summary, in the architectures of the traditional type the word lines of a matrix, both of the NOR type and of the NAND type, are independent from each other and the potential for selecting the cell to be read or programmed is applied to only one matrix row. This approach necessarily implies dedicated decoding networks for each sector with an increase in the number of lines and of transistors.

This field suffers from the length of the memory cell arrays which require high propagation times in the reading step for allowing reaching the cells being farthest from the node to which the reading potential is applied. Moreover, it is also to be noted that the lithographic sizes for the manufacturing of non-volatile memories have reached limits lower than about 65 nm, or even than 32 nm, such as to make not only the construction of the interface between the decoding circuitry and the matrix of the cells themselves difficult, but also such as to enormously increase the propagation times of the signals due to the lines length.

In this respect, an important role is played by the row decoding, whose architecture largely conditions both the sizes, and the access time of the memory. This is particularly true where the row lines reach the extreme compactness levels, mainly in Flash of the NAND type, the problem becomes extreme and the implementation complex to such an extent as to make the area occupation inefficient.

The program and erase operations occur by exploiting the Fowler-Nordheim phenomenon, while the reading is an operation of the dynamic type. Well, even due to this the reading step is slowed down a lot.

It is to be remembered that in a sector of the NAND type the smallest erase unit is made of a group of word lines equal to the number of cells of the stack included between the SSL and DSL lines which intercept them, i.e. 16 or 32 according to the memory sizes.

This implies that each stack elemental structure has a very reduced conductivity being thus a great limitation to the reading speed. The conventional stack structure (16, 32 cells) is thus intimately slow since it is not very conductive.

Finally, it is to be signaled that current NAND memories do not allow performing an operative code, for example of the XIP type, since the random access time typical of these architectures is on the order of 10-20 usec. The reason of such slowness is due to the particular organization of the matrix which normally comprises groups of 16/32 cells in series which strongly reduces its conductivity, connected to each other through long selector lines which significantly decreases their propagations with long bit-lines which strongly burden the load.

The increase of the load due to the BL is significantly greater than in the corresponding NOR-Flash since in the NAND-Flash the generic BL collects the capacitances of all the stack or column structures which, combined with the large capacitances of the memory, remarkably increase its value.

SUMMARY OF THE INVENTION

The present invention is directed to providing a matrix architecture for a non-volatile memory electronic device of the monolithically integrated type, i.e. realized on a single chip, having such structural and functional features as to incorporate a memory matrix divided into at least one pair of portions having different data storage capacity and different access speed.

A further object of the invention is that of providing a memory device of the indicated type and having structural and functional features of greater compactness and such as to simplify the modes of access to the memory overcoming the limits and the drawbacks of the solutions proposed by the known technique.

Another object of the present invention is that of providing a type of memory electronic device having such structural and functional features as to offer the same performances as a Multi Chip Package however overcoming the limits and the drawbacks of that type of approach.

A further object of the present invention is that of providing a type of memory electronic device wherein the two portions of memory matrix having different data storage capacity and different access speed can exploit the same structural sources but can be decoupled according to the operation needs by the user.

Still a further object of the invention is that of providing the introduction, with respect to the traditional methods, of a selection of the matrix rows so as to minimize the cell network and make more simple the realization thereof.

The present invention realizes a memory integrated architecture having at least two areas or portions with different data storage capacity and different access speed which exhibit continuity between the bit lines structures and share both the read and program resources, which maintain the same protocol and operative management procedures, and which tolerate different propagation and conductivity times in the two sections.

More particularly, the memory integrated architecture has a fastest section that includes measures suitable to improve its conductivity, to reduce the propagations, to minimize the load.

More in detail, the same fastest section implies physical sectors melded with each other by multiples of two, four, etc. short-circuiting the pairs of word lines with each other, for example short-circuiting a row of a physical sector with a corresponding row of the adjacent physical sector, thus obtaining a logic sector which becomes the smallest unit entirely erasable by the new architecture. In any case the integrity of the data is maintained in each array cell safeguarding in the meantime the functionality of the structure, the correspondence between the rows being moreover definable according to the needs of the device layout.

BRIEF DESCRIPTION OF THE DRAWINGS

The features and advantages of the memory electronic device and of the relative programming method according to the invention will be apparent from the following description of an embodiment thereof given by way of indicative and non-limiting example with reference to the annexed drawings.

FIG. 9 shows a comparative table reporting the biasing values of the row and column selectors of the well region wherein the memory cells are realized for a matrix portion of the conventional type and for the matrix portion according to the invention respectively.

FIGS. 19 and 20 show respective schematic views of further embodiments of strap techniques for the device according to the invention.

FIG. 21 shows a schematic view of the device of FIG. 3 wherein portions of slow, fast and intermediate speed portions are highlighted between the two ones realized according to the principles of the present invention.

DETAILED DESCRIPTION OF THE PREFERRED EMBODIMENTS

Figure 2:
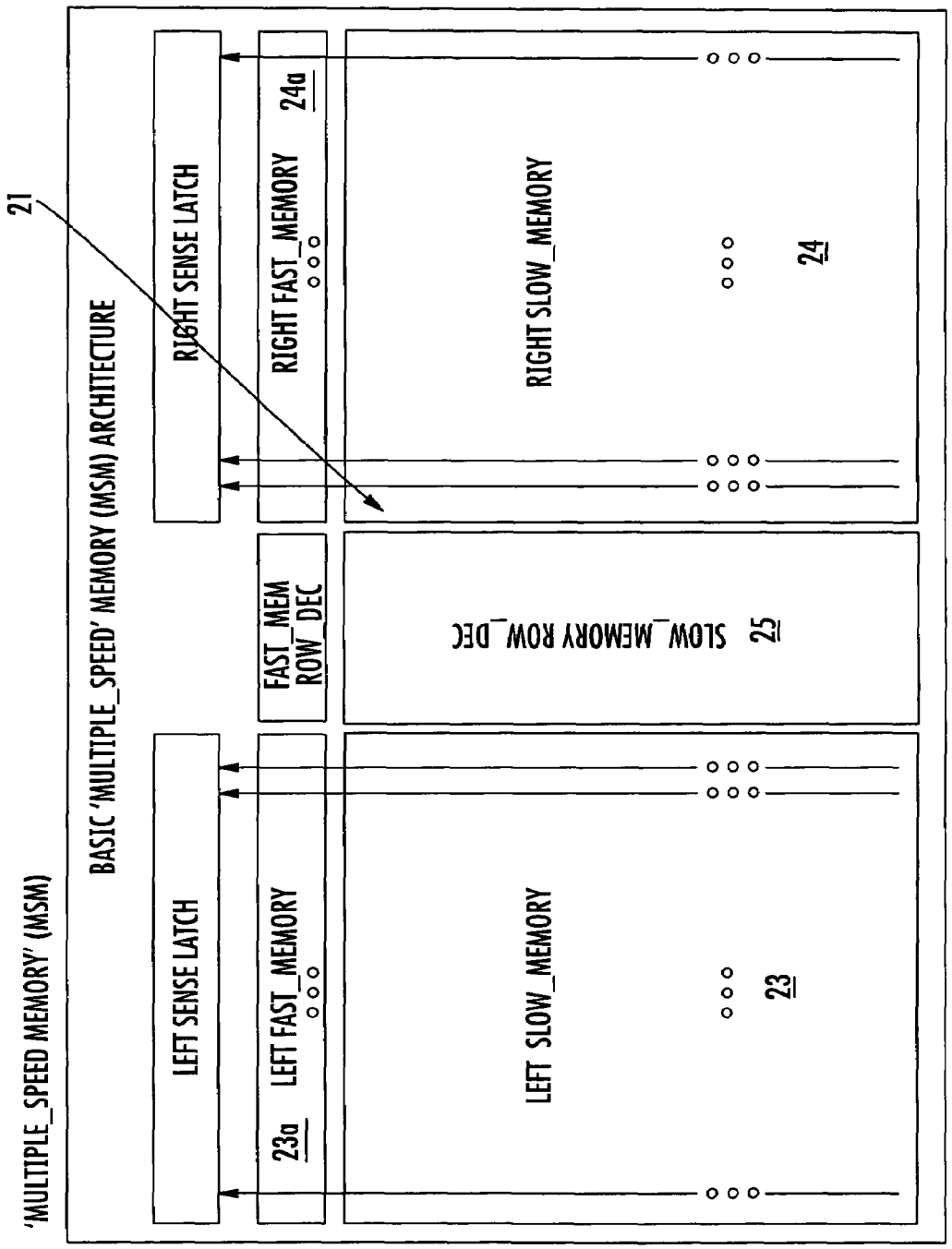
FIG. 2 shows a schematic view of a memory electronic device, in particular an EEPROM memory with NAND architecture realized according to the present invention.

With reference to the figures, and in particular to the example of FIG. 2, a new memory electronic device realized according to the present invention and monolithically integrated on semiconductor is globally and schematically indicates at 20.

The device 20 incorporates at least one matrix 21 of memory cells organized in rows or word lines WL and columns or bit lines BL. In the embodiment here described by way of non-limiting example, the device 20 is a memory of the Flash EEPROM type with an architecture of the NAND type. However, nothing forbids that the principles described herein to be applied to a Flash NOR memory, or to an EPROM, or even to a Flotox EEPROM.

Figure 4:
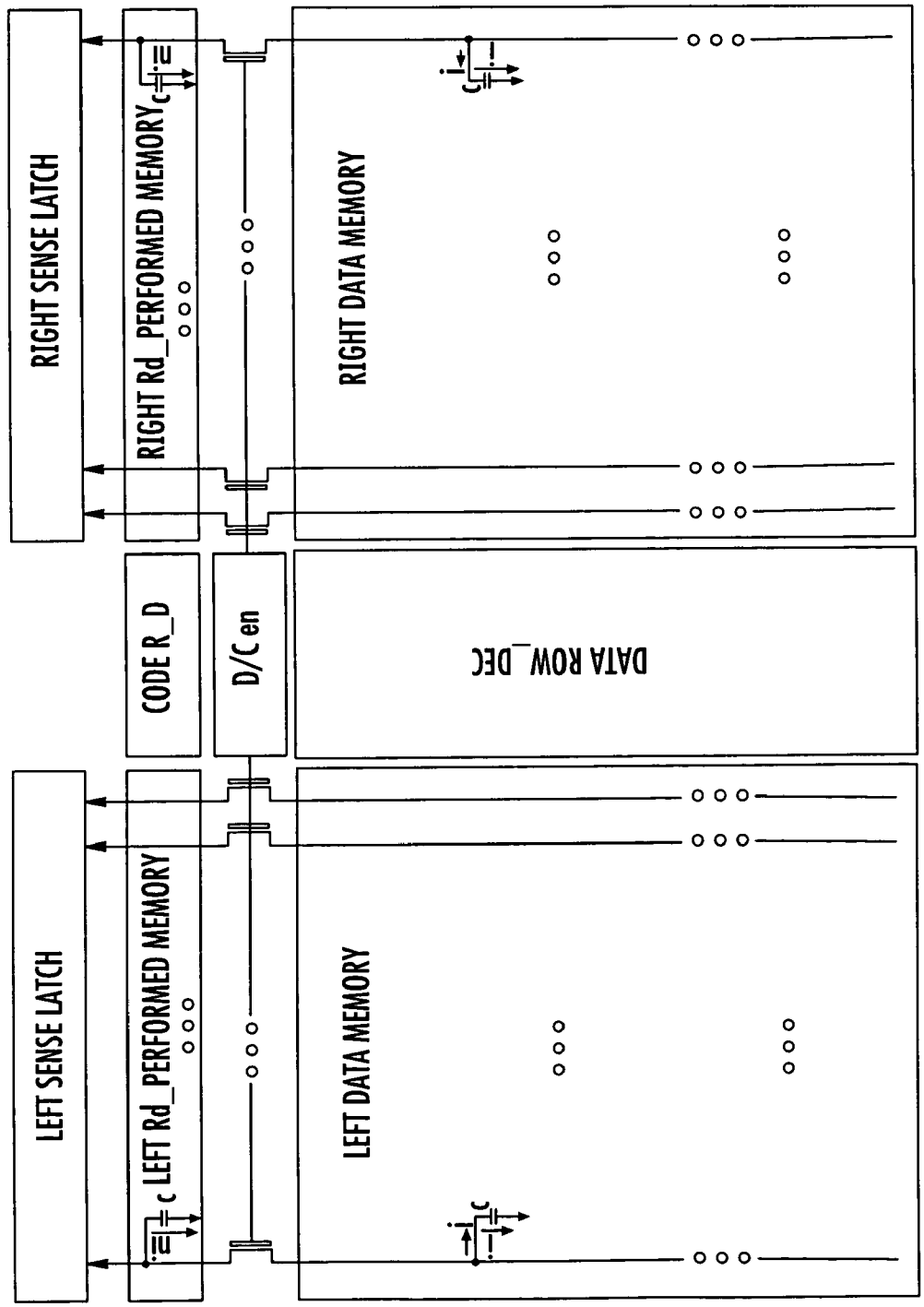
FIG. 4 shows a further schematic view of the device of FIG. 3.
Figure 4A:
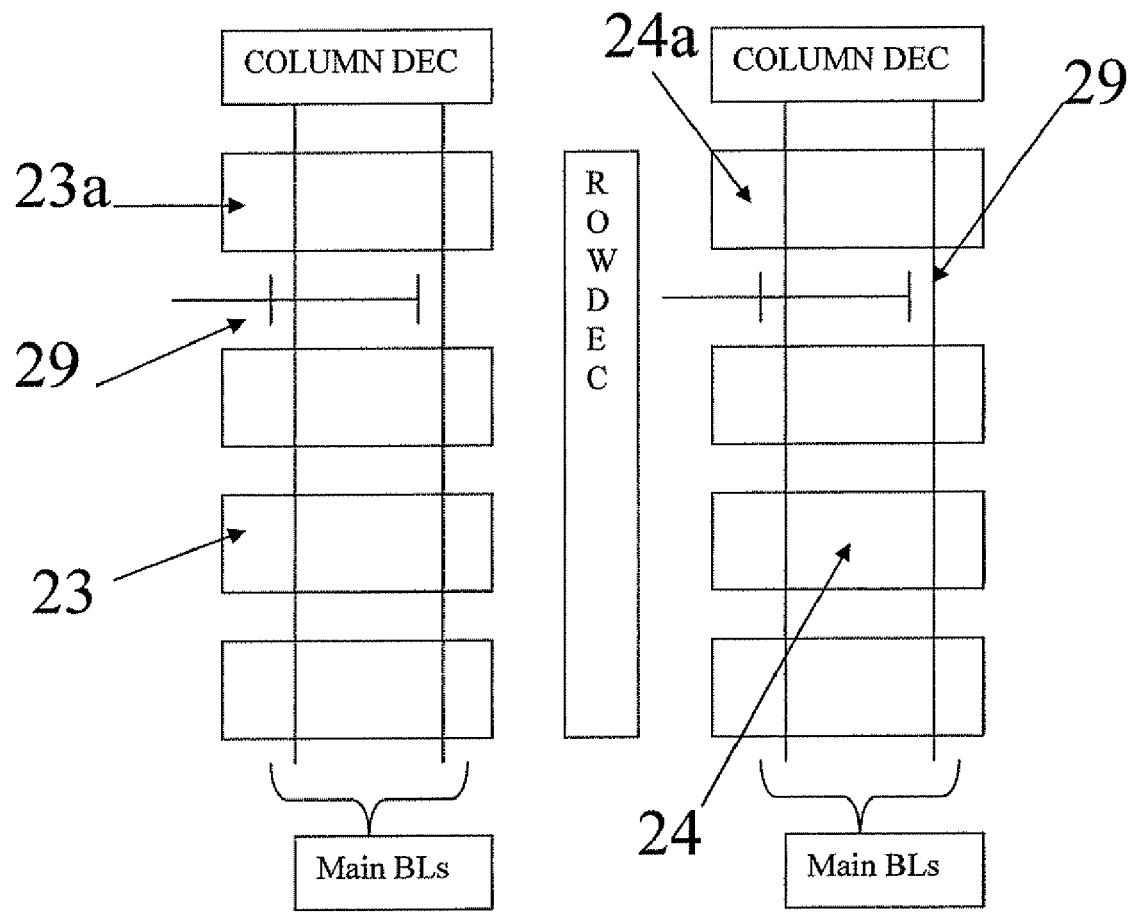
Figure 6:
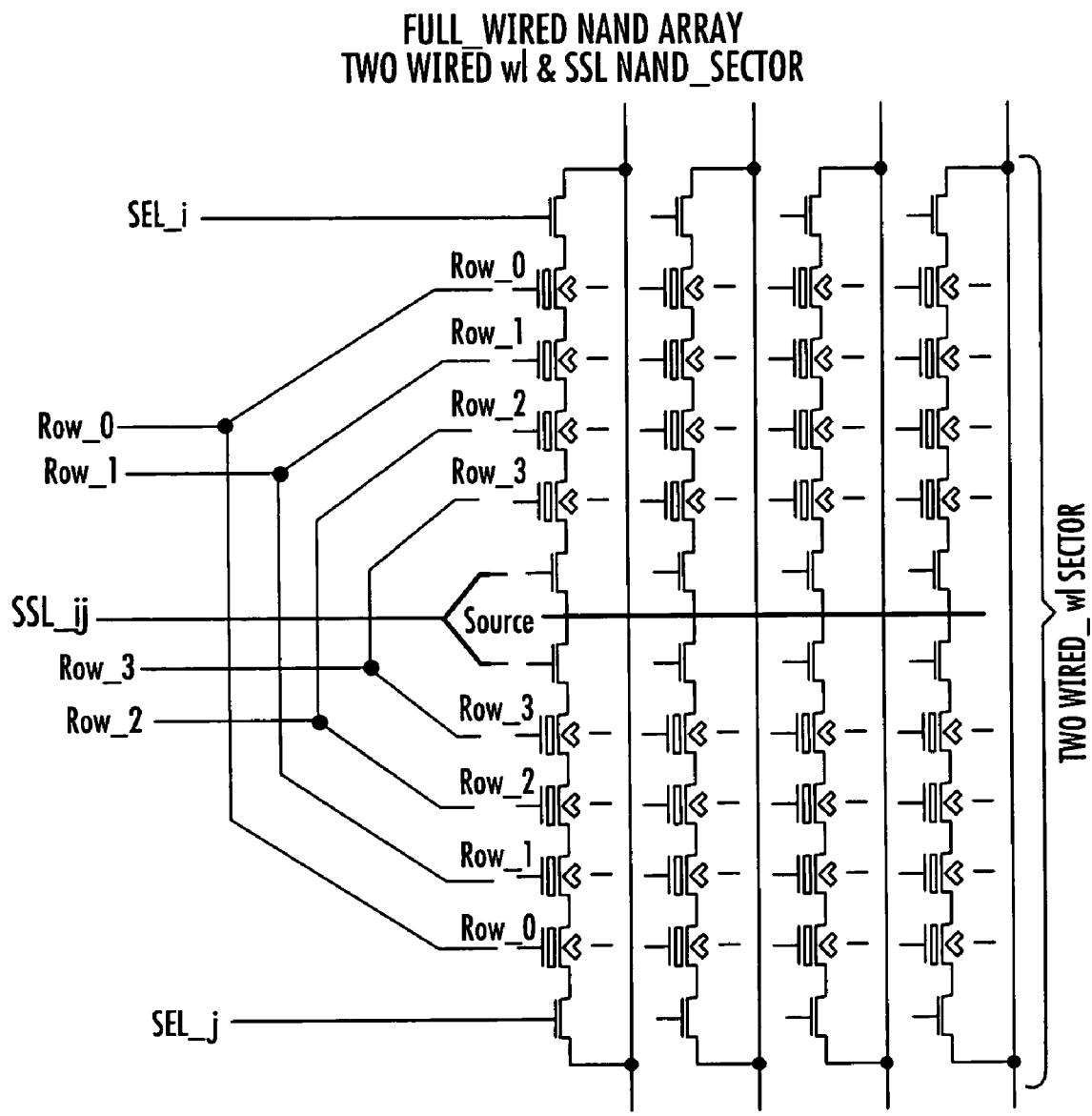
FIG. 6 shows a schematic view of a portion of the memory electronic device, in particular an EEPROM memory with NAND architecture, realized according to the present invention.
Figure 8:
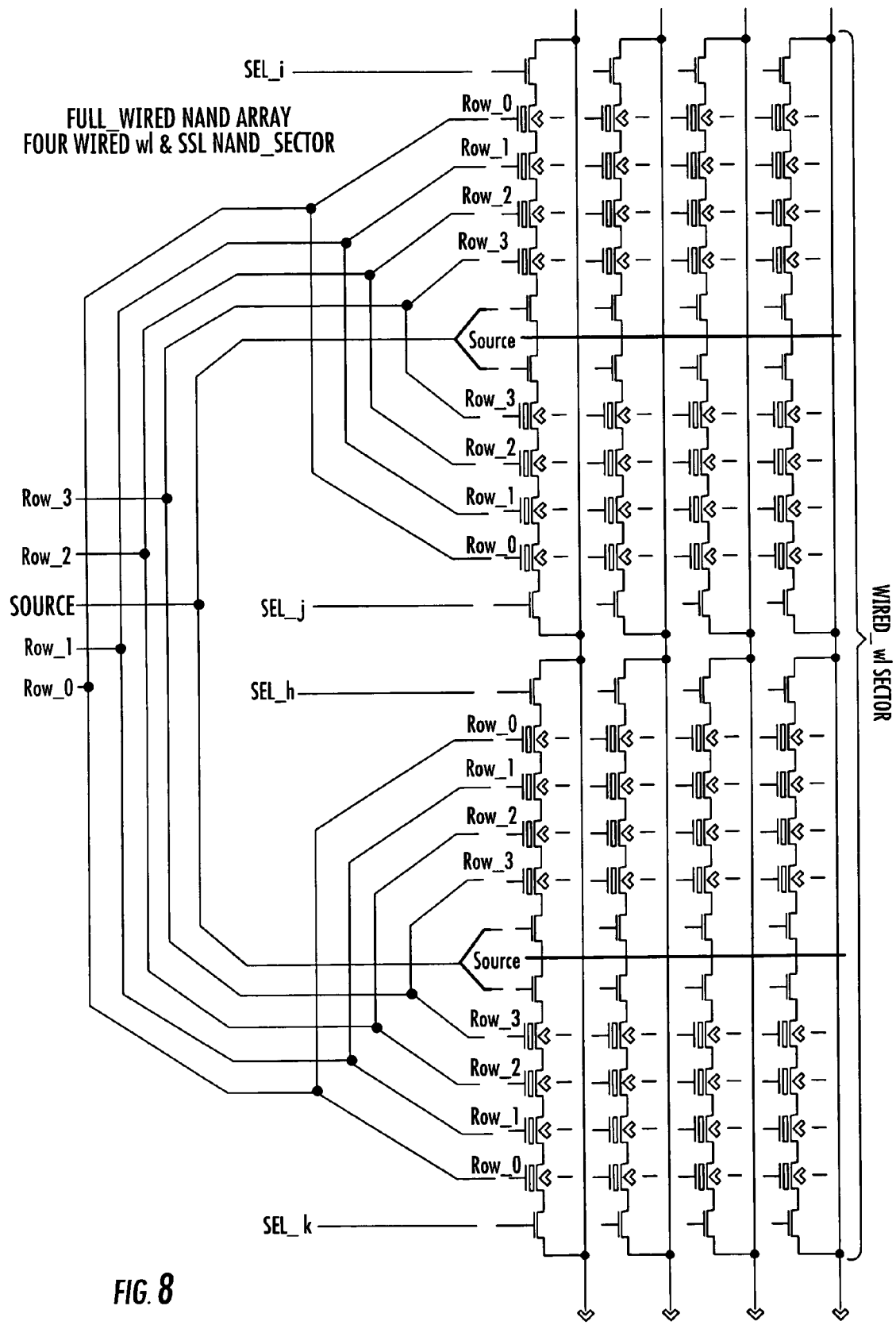
FIG. 8 shows a schematic view of a portion of memory electronic device realized according to the best realization mode of the present invention by way of a different coupling of word lines with respect to the example of FIG. 7.

The only particularity is given by the fact that the memory matrix has a Bit Line which is common to more physical sectors of the matrix; in particular such Bit Line can be a MAIN Bit Line, as schematically shown in FIG. 4, which is locally decoded in LOCAL Bit Lines for acceding to the memory cells of each physical sector (not shown in FIG. 4). FIGS. 6 and 8 instead show two possible implementations of the array relative to the fast sections 23a and 24a of the Flash EEPROM memory with NAND architecture of the device 20.

The memory allows, to the expense of a slight modification of the array of a NAND memory, to realize in a single chip, and thus with a single technology, a group of functions being typical of different memories and up to now obtained only by way of devices of different nature and structure. In other words, the device 20 is realized on a single chip which integrates both the "hard disk" and boot ROM functions, avoiding the use of the assembly of several components coming from different technologies, even if arranged on a same package.

Figure 1:
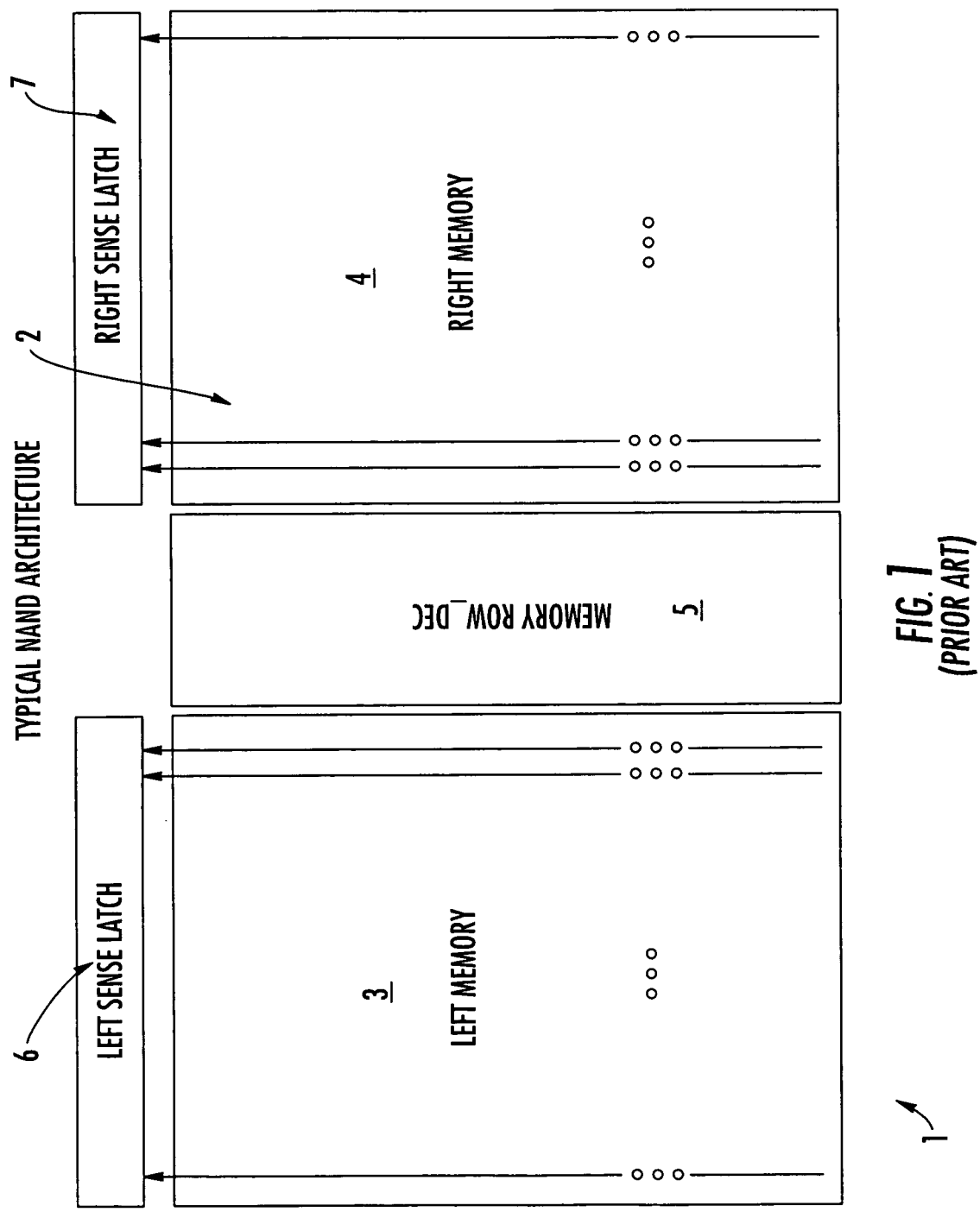
FIG. 1 shows a schematic view of memory electronic device, in particular an EEPROM memory with NAND architecture realized according to the prior art.

As already previously seen, FIG. 1 shows a schematic view of memory electronic device 1, in particular an EEPROM memory with NAND architecture realized according to the prior art. This type of architecture provides a very organized structure of memory cells divided into two sub-matrixes 3 and 4, left L and right R, referring to a single row decoding block 5 centrally arranged in the device 1.

Each one of the sub-matrixes 3 and 4 corresponds to a bank of registers of the read amplifiers or sense amplifiers 6 and 7. It should be noted how both the Wl and the Bl are continuous and global lines, without any fragmentation.

Thanks to this particularly organized structure the area consumed by the array is reduced and significant memory capacities can be easily obtained even of a 1 Gigabit or up to a 2 Gigabit and more.

With this advantage also different drawbacks are however associated:

the Wl are very long: thus resistive, capacitively heavy and definitely slow to propagate the signal up to the array edges;

the Bl are in turn very long, they collect a very high number of nodes which, summing an enormous capacity, create a load which causes extremely long times in the read transistors; and the elemental structure of each sector exhibits a great number of devices in AND configuration (16, 32, as reported in FIG. 26), which drastically reduces the conductivity and which, consequently, will not impose fast dynamics in the verify step.

A new architecture of NAND memory electronic device 20 is proposed wherein inside a same sub-matrix 23, 24, L or R, a smaller or however reduced sub-matrix portion 23a, 24a has been obtained, for example of 32 Megabit or 64 Megabit on global 1 Gigabit. The consequence of this subdivision is the realization of two portions whose bit lines BL have remarkably different sizes and capacitive weights, for example: short and light for the fast portion, long and heavy for the slow portion. The impact of this choice on the evaluation times will not be negligible at all.

Figure 3:
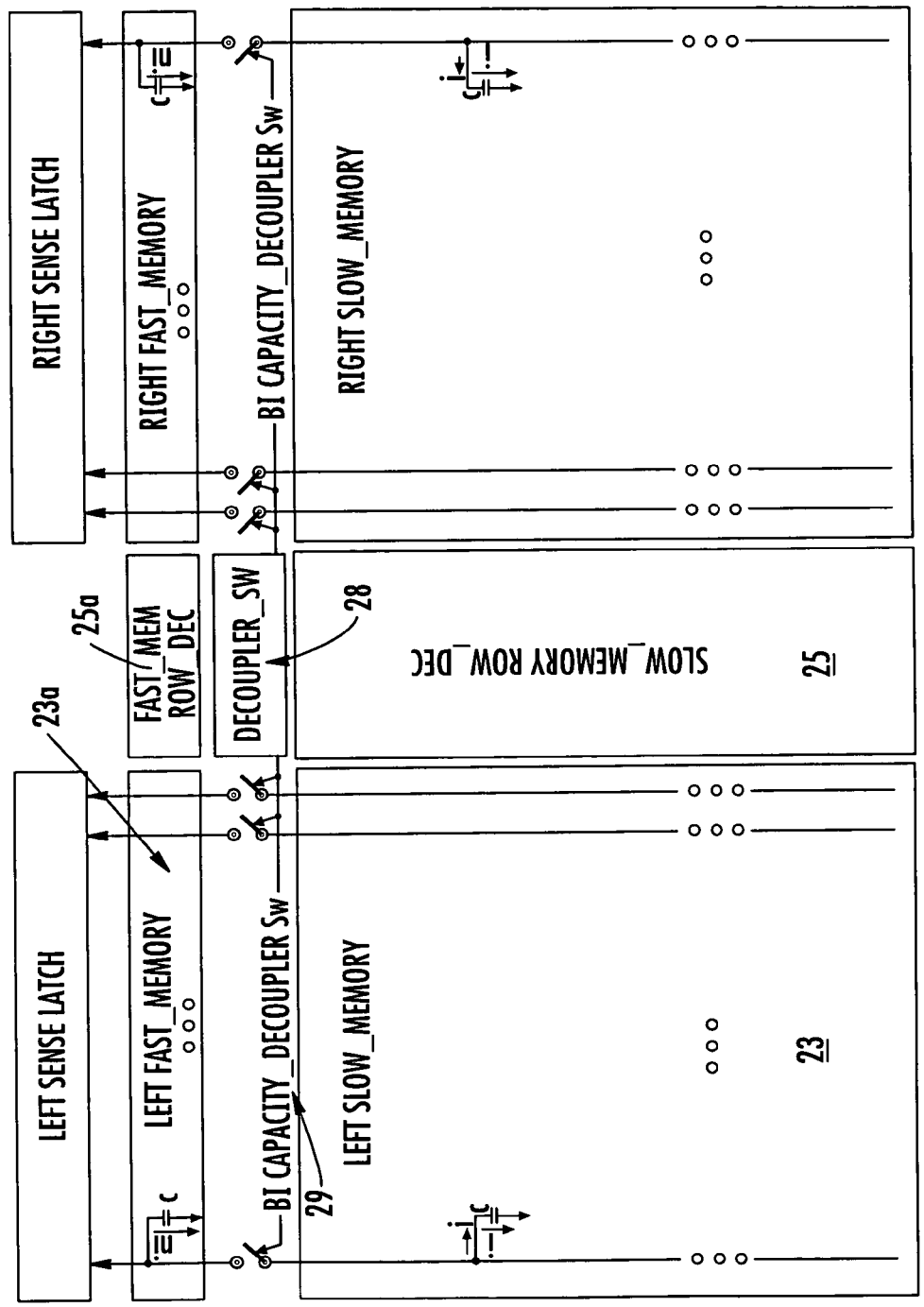
FIG. 3 shows a schematic view of the memory electronic device according to the present invention where a measure is highlighted for decoupling the bit lines shared by two portions of the cell matrix.
Figure 7:
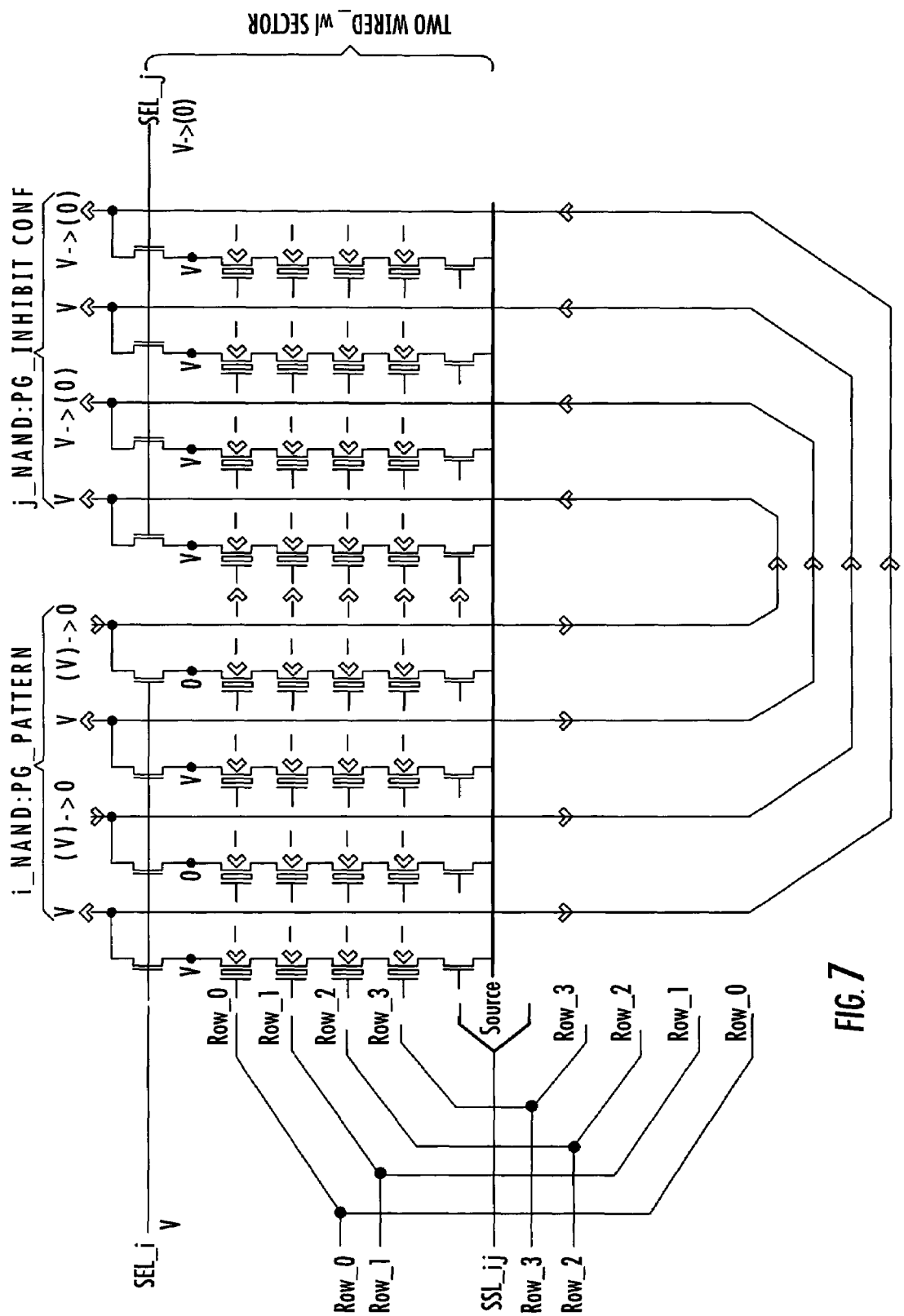
FIG. 7 shows a further way to illustrate the same memory portion according to the present invention already shown in FIG. 6 and highlighting the biasing values of bit lines in the programming step.

Moreover, such portion 23a or 24a, advantageously placed immediately close to the register and read structures is operative, thanks to suitable measures of array (FIGS. 23, 6 and 7), of Wl features (FIG. 15) and techniques for lightening of the load (FIG. 3, 4, 15) at a definitely higher speed than the classical NANDs, i.e. with access times being comparable to the most performing architectures of the NOR type.

Hereinafter reference will be often made to only one of the two sub matrixes L, R, for example the one indicated with 23a, using for it the term matrix.

As it can be appreciated from the example of FIG. 2, the matrix portion 23a hereafter called "fast" is contiguous to a major matrix portion 23 called "slow", which is the higher part thereof with further connection function with the read & modify interfaces. This peculiarity allows two important advantages to be achieved: it ensures size compatibility and continuity of the lines crossing the different matrix portions, and it allows a perfect "lightening" of the load for the fast portion with the really valuable consequence of speeding up the pre-charge & verify operations.

It is important to remark that when we speak about size compatibility and continuity of the lines we mean that the two fast and slow sections exhibit the same number of Bl and that each Bl of the one is the continuation of the homonymous of the other being the portion Bl separated only by a device_switch 29, i.e. a pass transistor or a simple transistor switch.

The device_switch 29 has a fundamental function on the definition of the performances of the two portions. In fact it provides to "capacitively decouple" the Bl of the fast portion (short and light) from the Bl of the slow portion (long and capacitively heavy) consequently facilitating the speed of the first portion 23a.

Therefore, any time one operates on the fast portion, said device_switch 29 is made 'OFF' with the aim of minimizing the load and allowing the maximum speed thereof. To the contrary, when one operates on the slow portion said device_switch is maintained 'ON' thus establishing the continuity between the Bl of the two sections and the readings which are started therein will have response times aligned to those of a conventional NAND_Flash. The fact that the MAIN Bit Lines can be interrupted is important, for example between a first and a second physical or logical sector adjacent to the column decoding. The switch 29 decouples the capacitive loads of the MAIN Bil Line BL obtaining a functional separation of the main bit line.

A further measure which distinguishes the fast portion 23a and improves its performances is the adoption of "Wl strap techniques", which, widely described hereafter, allow the fundamental reduction of the propagation times of the selection signals.

Figure 12:
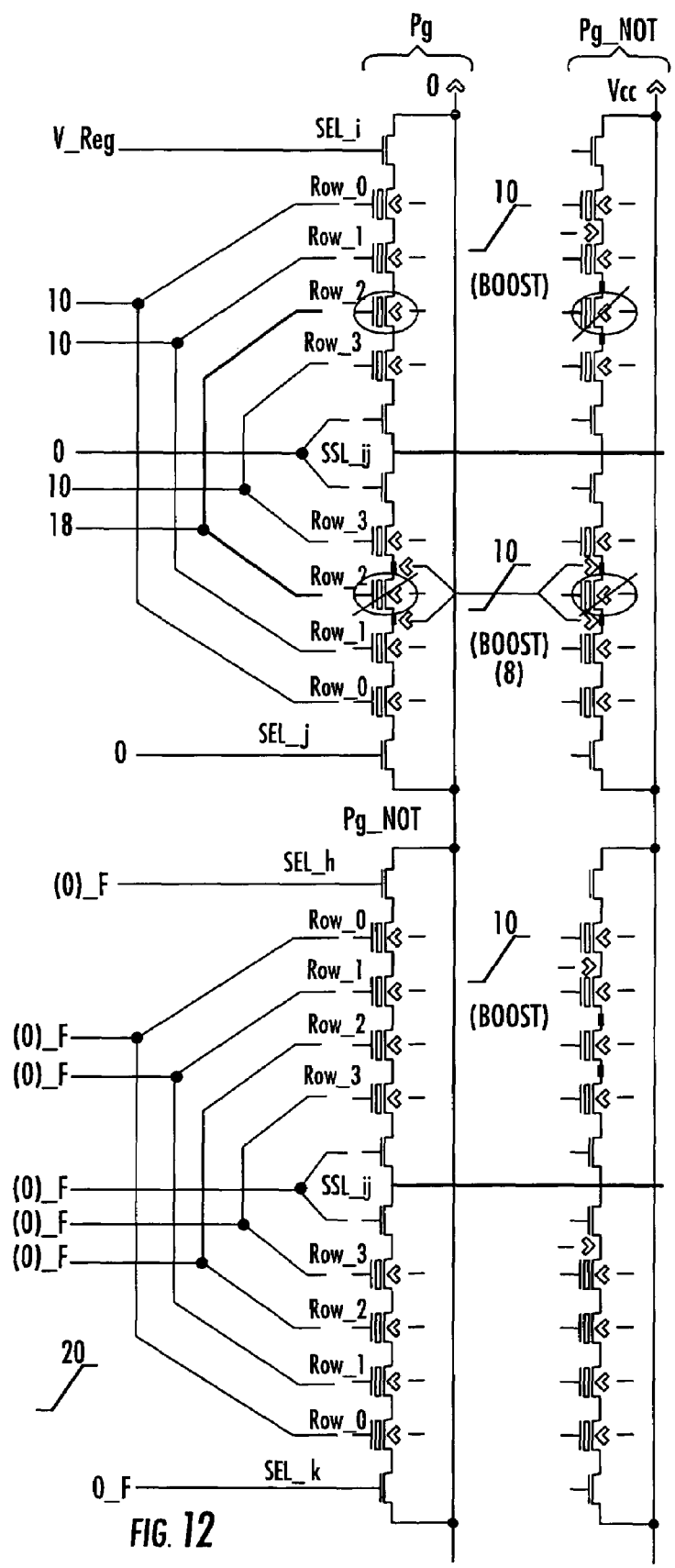
FIG. 12 shows a schematic view of the portion of FIG. 7 during the programming step of the content of a memory cell.
Figure 13:
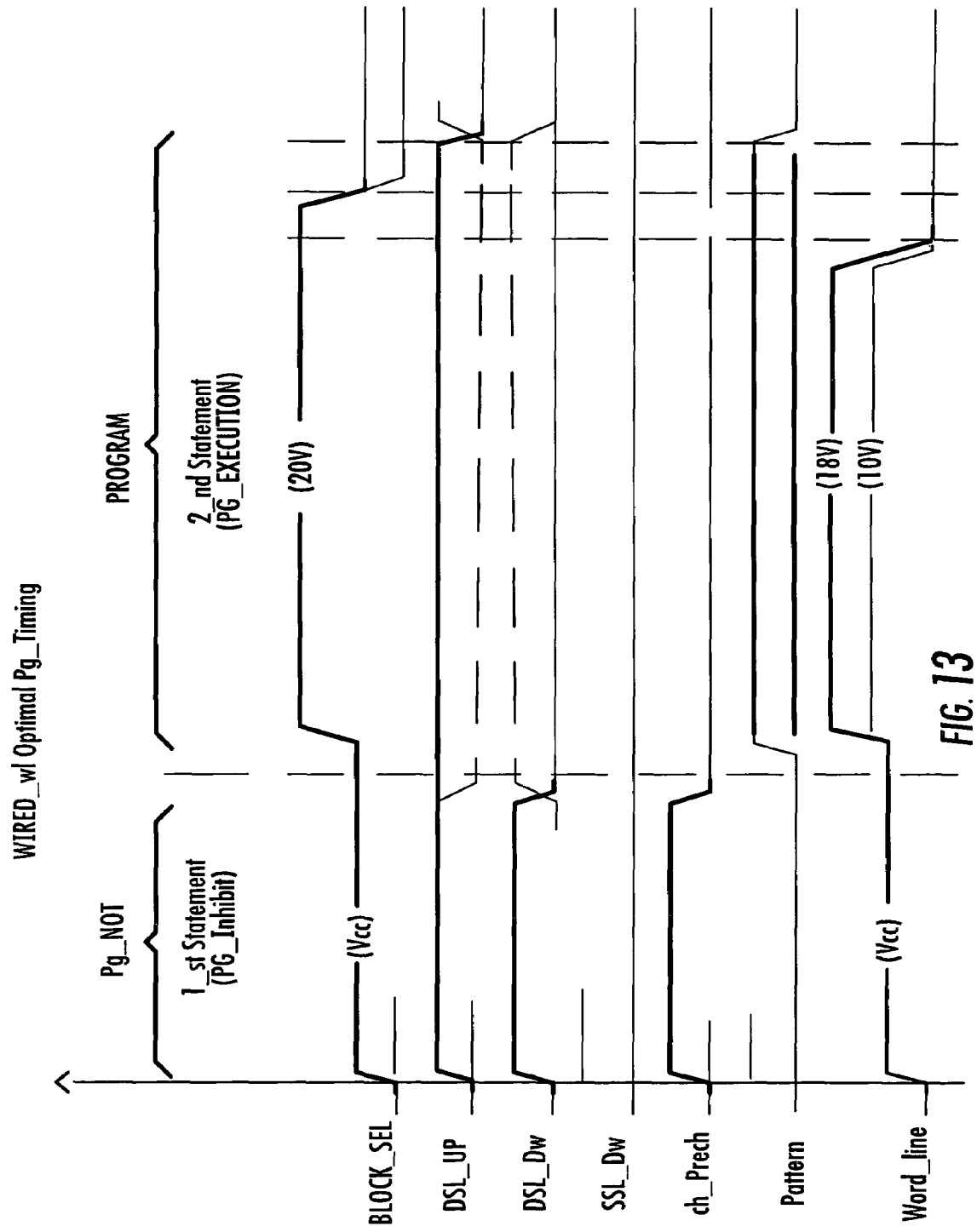
FIG. 13 shows, on a diagram with same time basis, the trend of a group of signals of the programming step of the memory matrix portion according to the invention for optimizing the functionality thereof.
Figure 14:
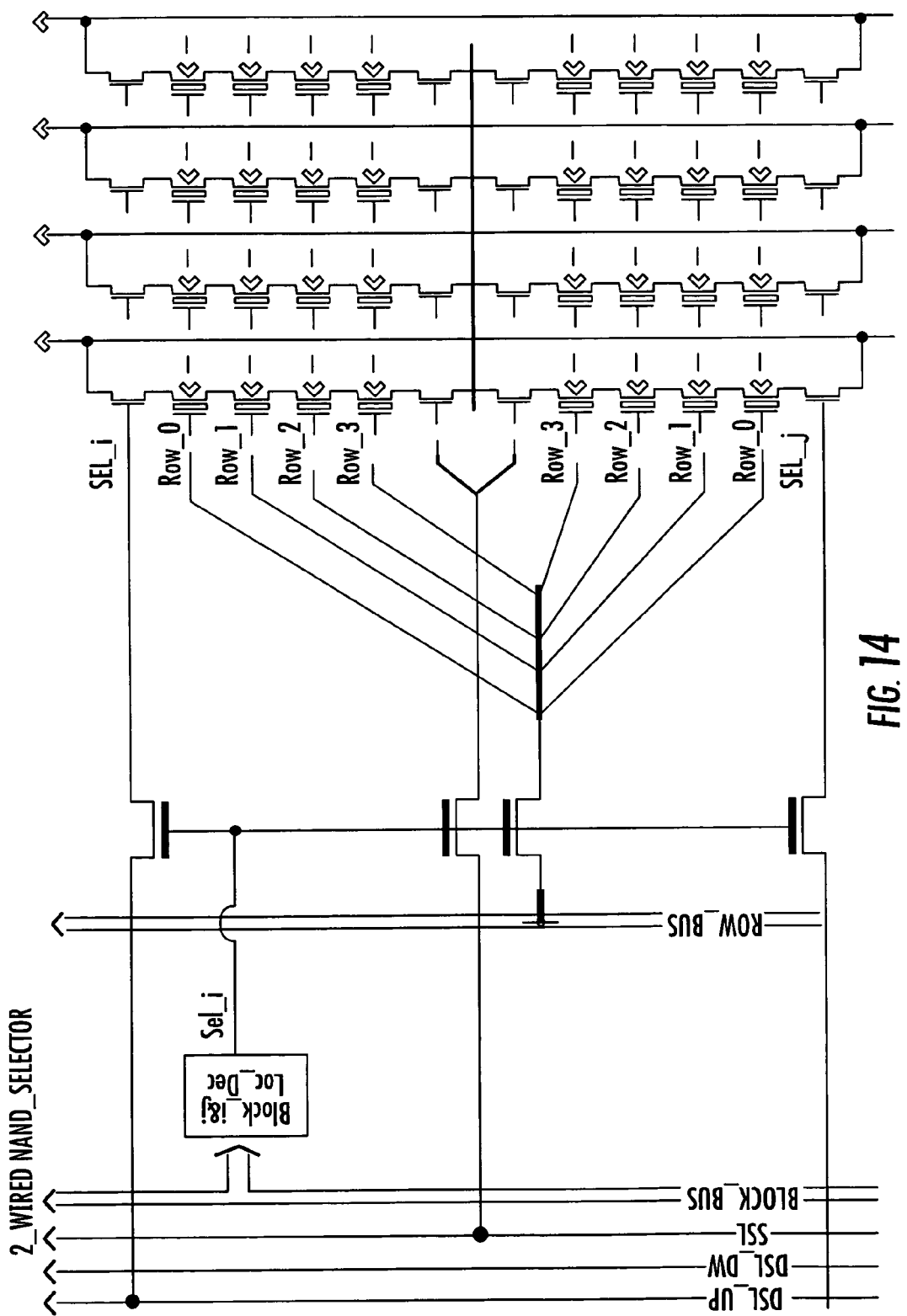
FIG. 14 shows a schematic view of a portion of the memory device according to the invention wherein a single selector block is provided for two word line groups.

The feasibility of the improvement is made possible by the particular management of the Wl of the fast portion as reported by FIGS. 6, 8, 14 together with the innovative operation modes shown in the FIGS. 10, 11, 12, 13 and summarized in the table 1 of FIG. 9.

Advantageously the portion 23 is apt to the data storage and it comprises blocks being compatible with the features of a non-volatile memory of the Flash type which, although slow, allows a significant reduction in the occupation of circuit area. In other words, the portion 23 is at high density of memory cells.

With the data storage portion 23 a corresponding row decoder 25 centrally arranged in the device 20 between the two sub-matrixes 23 and 24 is associated. Similarly, with the code storage portion 23a a corresponding row decoder 25a centrally arranged in the device 20 between the two sub-matrixes 23a and 24a is associated.

The cells with which the portion 23a of the fast type is constructed have the same electrical characteristics as those of the cells of the portion 23 of the "slow" type, i.e. they are programmed and erased according to identical modes, but they are organized in such a way as to operate with a higher read current. The conductivity increase of the elemental AND structures of the fast portion is advantageously obtained simply by reducing the number of the devices: four instead of 16 or 32 (FIGS. 6, 8, 23) but it can be also thought in an alternative way operating parallelisms on basis 2 or on basis 4 as shown in FIG. 24.

A great advantage deriving from the proposed approach lies in the management of the different functions (Pg, Er, Rd) of the fast portion 23a shared with the slow portion 23. This peculiarity has been developed on purpose so as to avoid additions and/or modifications to a traditional NAND architecture preserving the low current consumption and a high write/erase speed philosophy.

Figure 5:
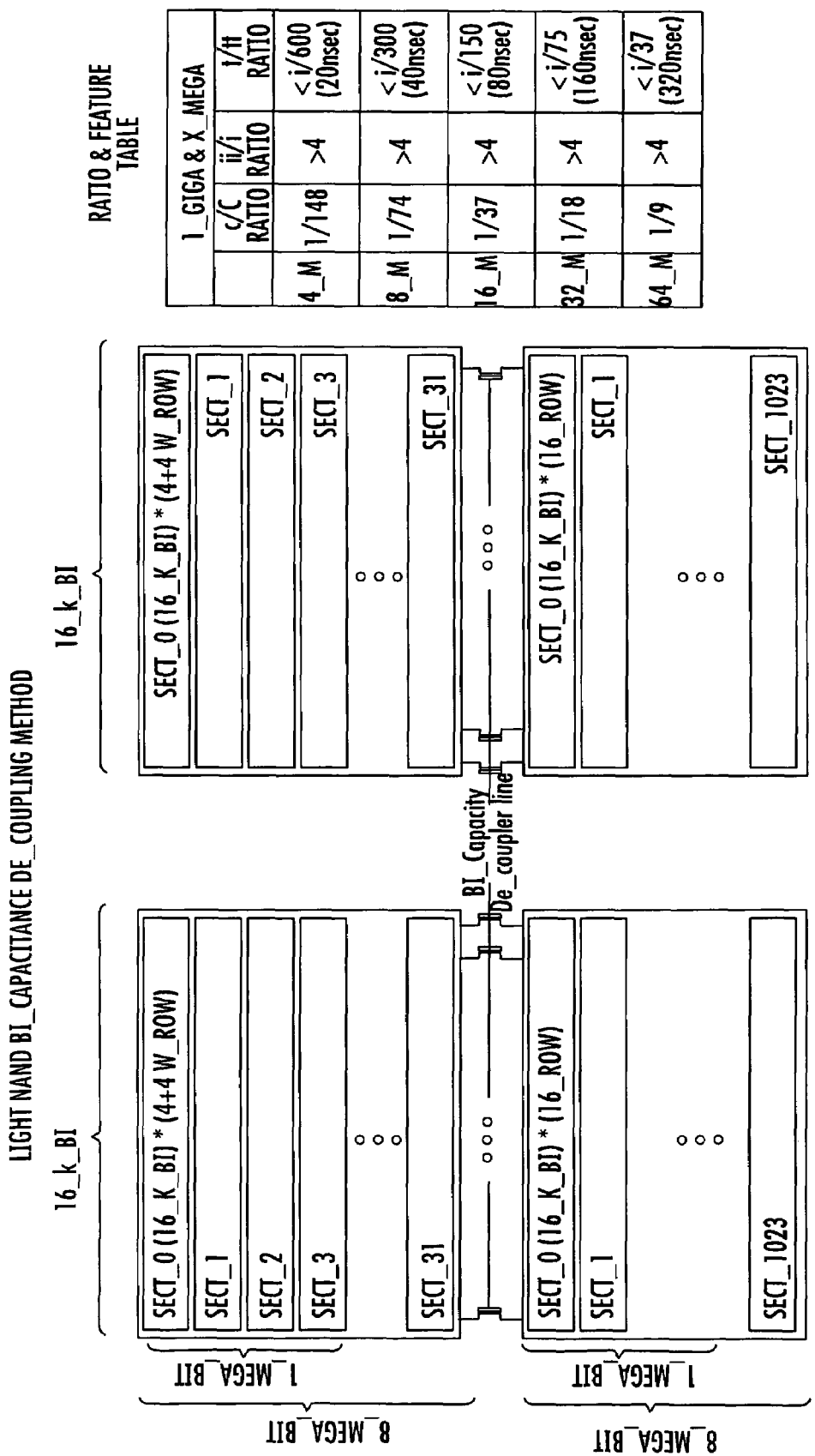
FIG. 5 shows a schematic block view and in greater detail of a portion of the device of FIG. 3.

Summarizing, the structure of a non-volatile memory electronic device 20 is monolithically integrated on a semiconductor and of the Flash EEPROM type with a NAND architecture, comprising at least one memory matrix 21 organized in rows and columns of memory cells but having the peculiarity that the matrix is divided into at least a first 23 and a second portions 23a having different data storage capacity and different access speed, although sharing the same bit lines structures. The second matrix portion 23a is faster and it has lower sizes with respect to the first matrix portion 23. For example, the second portion 23a can be of 32 Mbit or 64 Mbit on global 1 Gbit of the portion 23, as shown in FIG. 5.

Moreover, the second portion 23a operates with access times comparable to the NOR memory architectures, even if the cells with which the second portion 23a is constructed have the same electrical characteristics as those of the cells of the first portion 23. In other words, the memory cells with which the second portion 23a is constructed are programmed and erased according to identical modes with respect to the cells of the first portion 23, but they are organized in such a way as to operate with a higher read current.

Advantageously, moreover, the second portion 23a comprises groups of only four cells in series with the associated selectors. Current NAND memories do not allow running an operative code, for example of the XIP type, since the random access time typical of these architectures is on the order of the 10-30 usec.

The reason of such slowness is due to the particular organization of the matrix which normally comprises groups of 32 cells in series which significantly reduces its conductivity, connected with each other by way of long lines of selectors affected by significant slowness as regards to the signal propagations.

Moreover, each physical sector (and they are an enormous number) refers, with its own elemental structure, to a generic Bl which therefore accumulates a considerable capacitance value.

Such great capacitance, combined with the very low conductivity of the elemental structures of a conventional NAND_Flash, causes very long verify times. The idea of a single Bl, which collects the nodes of all the intersected sectors, perfectly responds to Bl compactness and minimization criteria but it may be disastrous and limiting for the dynamic aspect which results in extremely slowness. The slowness is well tolerated for the applicative part relative to "Data Storage" activities; it is instead intolerable and it cannot be proposed where a quick response is needed, as required by applications of executable codes: "Data_Code".

Normally, the cell matrix is divided only into the two sub matrixes 3 and 4, L and R, shown in FIG. 1. The portion 23a, which is limited in size and lightened of most the load, is fast and suitable to perform executable codes.

In fact, the cell matrix or sub matrix structured with the two slow 23 and fast 23a portions can be used for storing in these portions data of different type, for example a portion 23a can be intended for code storage activities and the other portion 23 can be intended to data storage activities.

The portion 23 being apt to the data storage has a size equal to 1 Gbit and it follows the traditional organization of the NAND cells with groups of sixteen/thirty-two cells with relative selectors and it can well tolerate a capacity of bit line of about ~5 pF.

The portion 23a, being apt to code storage, can be instead of suitable size, according to the users' needs, a size from eight to 16 Mbit seems to be enough for a program or system memory.

For example, FIG. 5 schematically shows the various logic sectors of the fast portion 23a with each sector made of eight rows (4+4 wired) and 16 k columns for a total of thirty-two sectors suitable to form an 8 Mbit memory per code storage. Whereas in the second portion 1024 sectors of 16 rows and 16 k columns are shown for a total of 1 Gbit of data storage. However, nothing forbids providing, for the portion 23a, a size of also 32 Mbit or 64 Mbit, obviously reducing the attainable performance.

Moreover, the bit line of this portion 23a although maintaining the direct connection with the underlying part is advantageously decoupled from the corresponding bit line of the portion 23 apt to the data storage (for this reason it is placed as terminal section) by way of pass transistors which will be hereafter called data bank selectors, but which do not expressively refer to the present invention.

The decoupling is activated any time a cell of the portion 23a is read (but it can also interest the modify operations). The decoupling is actuated by placing the pass transistors 29 in the "OFF" state, for example by forcing a GND potential onto the bank selector line.

Where, instead, it should be operated on the slow part (first portion 23) the decoupling is prevented by maintaining the pass_transistors in the "ON" state, for example by forcing a logic value '1' always onto the bank selector line. In this context the portion 23a acts as a communication bridge between the portion 23 and the read-modify registers: therefore configurations of Bl and verifications on the same occurs by way of the portion 23a.

More particularly, as clearly shown in FIG. 4, the bit lines of the two memory matrix portions 23 and 23a, slow and fast, substantially have the same structure and they can be considered common to the two portions 23 and 23a. However, the presence of a pass transistor 29 inserted onto the bit line in correspondence to the separation between the two matrix portions 23 and 23a allows decoupling a long capacitance of bit lines and to obtain at least a matrix portion 23a with a bit line of lower extension. As per construction, therefore, the Bl is much less capacitive and therefore it can be, equally as any other parameter, much easily managed and realize faster dynamics.

The decoupling operation, absent in the conventional memories, can be admitted since it is not necessary for maintaining the functionality of the portion 23a to propagate the signal downstream of the same.

Advantageously, the various pass transistors 29, each inserted onto a corresponding bit line between the slow matrix portion 23 and the fast matrix portion 23a, are connected in parallel with each other and they refer to an enable block 28 centrally arranged in the device 20 between the two row decoders 25 and 25a.

In summary, the device 21 is characterized in that the bit line of the second portion 23a is decoupled with respect to the corresponding bit line of the first portion 23 by way of pass transistors or bank selectors.

On the other hand, by decoupling the bit lines, the capacitance of the bit line of the portion 23a, in the here described embodiment by way of indicative example of 32 and 64 Mbit, is reduced to a value equal to $\frac{1}{32}$ and $\frac{1}{16}$ with respect to the totality corresponding to the two portions 23 and 23a.

Preferably, as already said, such portion 23a comprises groups of only four cells in series with the relative selectors. The groups are organized with wired word lines as it will be shown hereafter in the description with reference to the Figures from 6 to 13.

The reduction of the number of the transistors in series allows to significantly increase the working current. With this measure, and reasonably supposing an operation in a linear zone, the current of the memory cells of the portion 23a increases until it surely reaches the theoretical value equal to at least eight times the current of the memory cells of the portion 23 apt to the data storage.

It should be noted that by way of a simple system of two equations with two unknown quantities it can be evinced that the discharge time of the portion 23a bit line which is equal to $\frac{1}{256}$ or $\frac{1}{128}$ of the discharge time of the bit line sum the two portions 23 and 23a.

Therefore, the access time, as regards the only Bl, of the portion 23a is drastically reduced, even if not enough to take it again to a random access time typical of the memories used for running software without the use of RAM (XIP Flash).

For reaching the object of a reading with access times comparable with those of a Flash-NOR, in the memory fast portion 23a, the device includes the implementation of "strapped" approaches both on the word-lines, and on the DSL (Drain Select-Line) and SSL (Source Select-Line) as it will be hereafter described with reference to Figures from 14 to 20.

For this reason, the world lines have been managed in a wired mode since, thanks to this measure, the implementation is made possible of strap techniques which allow the signficant reduction of the propagations indispensable for the attainment of high performance. However, the wiring of the Wl is not immediately done, more than one problem having to be addressed for maintaining both the functionality and the "integrity of information" for each cell: the proposed approaches for making the wiring possible will be described in greater detail hereafter in a dedicated section.

Obviously, the previous array sizing in the Figure is reported only by way of example of the proposed idea and it does not exhaust all the possible combinations within the present invention.

In substance, the proposed architecture allows a user of the solid-state memory device to use it both as a data memory, and as a program and/or operative system memory. This latter feature cannot be offered by current Flash NAND memories due to the high random access time (>10 usec).

As already previously highlighted, so far this lack has been obviated by using memories of the RAM type wherein the program code or operative system is stored at the start of any electronic device.

Further advantage is given by the fact that the proposed architecture allows a bank of erasable memory to be available with higher granularity, for example 4 kB with respect to 32 kB, since the fast memory portion 23a is organized with logic sectors having groups of only four plus four cells instead of thirty-two as it occurs for the slow portion 23.

For a better comprehension of the device advantages, we hereafter report a series of features the new architecture of Flash NAND memory electronic device 21 allows obtaining:

a) a structure with at least two memory areas or portions with high speed difference;

b) the presence of a sub system with performances comparable with a data memory;

c) the presence of one or more memory portions with very fast random access and comparable with a memory of the NOR type;

d) the sharing of the functional structure for minimizing the circuit area occupation;

e) the same word line length (even if with remarkably different propagation times) and, in the meantime the same number of bit lines;

f) the sizes equivalent to a memory specifically apt to the data storage function;

g) the features of a conventional data memory in terms of: protocol compatible with that of a conventional data memory and array efficiency (array/die ratio) of a conventional data memory;

h) a number of masks employed in the manufacturing process of the integrated circuit equal to those typically employed for a process of the NAND type, with the advantage of employing a more easily reproducible technology with respect to a Flash NOR and therefore such as to ensure greater yield;

k) a lower silicon consumption with respect to the approaches proposed by the known technique in terms of MCP;

l) a lower consumption of current; and m) the possibility of programming the memory in the page mode with at least 512 Byte.

This set of advantages is efficiently obtained thanks to the new NAND memory architecture which will be also defined of the Multi Speed type, as it will be clear from the following description.

Figure 1A:
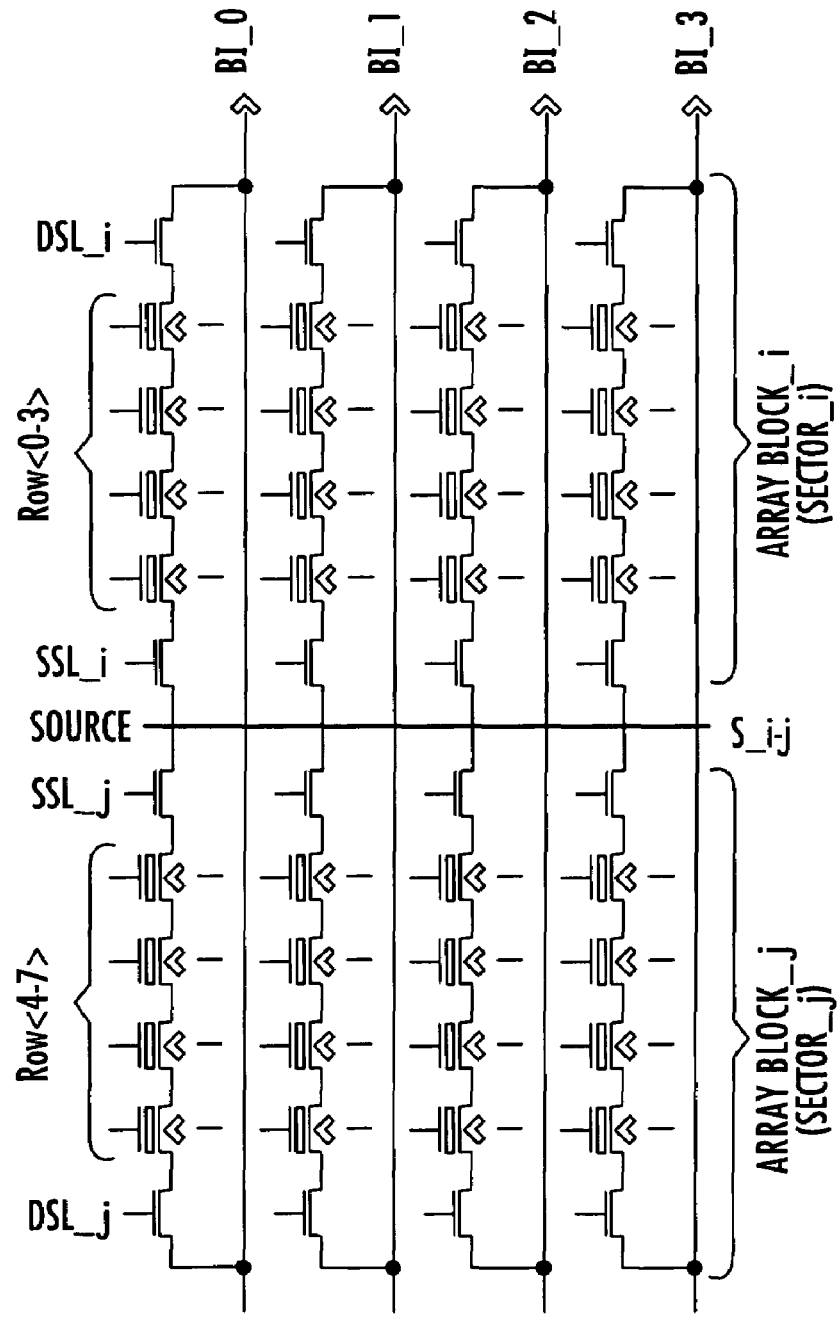
FIG. 1A shows a schematic view of a portion of memory electronic device, in particular an EEPROM memory with NAND architecture realized according to the prior art.

According to a further aspect of the present device, which will be now shown with reference to the FIGS. 1A and from 6 to 13, the architecture of the NAND memory electronic device is described in detail wherein inside the cell matrix the word lines are short-circuited in pairs and they are associated with a single source selector.

Obviously, the previous array sizing of FIG. 6 is reported only by way of example of the proposed approach and it does not exhaust all the possible combinations. A selection of the matrix rows is thus provided so as to minimize the decoding network and facilitate the realization of the memory device.

As it is well known, in the traditional architectures the word lines of a matrix are independent from each other and distinct from those of any other physical sector, i.e. the potential for selecting the cell to be read is applied to one and only one matrix row.

On the contrary, in the memory device 21 each single sector, which will be hereafter defined "logic sector", incorporates groups of wired Wl obtained by short-circuiting with each other pairs of "homologous" Wl. Two and four are the most advantageous multiplicity of wiring contemplable but also higher multiplicities, of eight and more can be used.

For example, FIG. 6 shows an embodiment of a wiring of two word lines Wl wherein the first row of a physical sector has been short-circuited with the last row of an adjacent physical sector, obtaining a logic sector which becomes for this architecture the smallest unit being entirely erasable.

Obviously, nothing forbids that this coupling can occur with different association modes between pairs of word lines. For example, the n-th row of a physical sector can be short-circuited with the n-th row of the adjacent physical sector, i.e. with the row having the same position within the adjacent physical sector.

It is thus understood how the possible coupling combinations are numerous. Moreover, these examples are valid in the case wherein a multiple of two has been chosen for the coupling of the word lines of a given logic sector, thus with word lines coupled in pairs. The association process can be extended to all the physical sectors and with the desired multiplicity.

It should be noted that in the illustrated architecture only one sector SSL_ij of source line SL is provided for each pair of adjacent physical sectors, i.e. one single SSL for each logic sector. Whereas more drain selectors (DSL) are provided according to the implemented wiring multiplicity.

With this measure, as it will be hereafter made clearer, the single logic sector (which can be functionally defined as such) comprises all the groups having the wired Wl. In a conventional NAND memory the physical sector only includes an SSL, a DSL and the Wl belonging to the group defined by the two selection lines.

Thus, there is a fundamental difference between the definition of logic sector and the physical sector of a conventional matrix. A consequence of this feature is that the sizes of the logic sectors between the two portions 23a and 23 can be different since the elemental structure of the same portions is different.

In particular, for low wiring multiplicity, for the fast portion (23a) there are logic sectors being smaller than the corresponding slow portion (for example: for a multiplicity 2 there is a sector size of 4+4 rows, against a size of 16/32 rows of the slow portion). The portion 23a is characterized, generally, by smaller logic sectors: the granularity with respect to the erasing is thus higher and this is a further advantage of the device.

The integrity of the selection of a given cell is thus ensured by the drain selector, which must be maintained distinct for preserving the univocality of the row decoding operation, in FIG. 6 the presence of the upper drain selector SEL_i and lower SEL_j is to be noted. With this technique the matrix rows are biased at least in pairs or in groups of four, eight etc . . . according to the multiplicity of association and grouping of the word lines.

FIG. 8 schematically shows a wiring embodiment between four Wl which, in a conventional matrix, would have four physical sectors and which have been instead incorporated in a single logic sector having a single source select line SSL and four respective drain selectors.

It should be highlighted that the wiring between more Wl allows reducing the number of the drivers necessary to stimulate the selection of the different selection lines. In fact, in a conventional Flash_NAND memory, taking into consideration a generic physical sector, as many selection networks are needed as many the Wl (16, 32, . . . ), SSL (1) and DSL (1)) are with the great difficulty of realizing the networks in an area whose height is of a single elemental NAND structure. This results in a disadvantageously cumbersome layout due to the very reduced available space.

The wiring, requiring, besides, a modification of the decoding network which will be described hereafter, allows reducing both the complexity of the same and the number of the necessary networks themselves; not only: the available height for its execution is equal to the number of elemental structures recalled by the multiplicity of wiring (2, 4, 8). A very advantageous executive condition derives wherein simplified networks are implemented in generous spaces making relaxed layouts, distant from technologically difficult passages and, as a matter of fact, engaging definitely more reduced areas.

Obviously, the higher the number of wiring of the word lines, the wider is the facilitation of the structures that interface to the matrix. As a consequence, with this wiring method the criticality imposed by the smallest size of the row lines is completely eliminated which implies, as previously already said, a high number of interconnections and the fragmentation of the same decoding network.

A row decoding is also provided suitable to manage a different organization of the wired Wl, so as to make it functional and at the same time to simplify its network and reduce its global number of transistors. In fact, the typical one-to-one decoding scheme of the conventional NAND memories cannot be applied to the fast matrix portion 23a as that of FIG. 6 or 8 with word lines of the wired type.

FIG. 14 shows the update of the row decoding relative to the wiring of 2 Wl. As it can be observed the decoding scheme involves the lines of two elemental structure (two being the multiplicity of wiring considered), it lies on a single selection block (Block_i&j) which controls the enabling/disabling of the single management MUX of the sector predisposed for the stimulus of the Wl (4 lines), of the DSL (2 lines) and of the SSL (1 line). The inputs of the MUX are connected to the bus of the rows (4 lines) whereas the outputs are connected to as many pairs of wired Wl. Moreover, the same MUX controls the communication between the bus of the drain selection lines (DSL_Up & DSL_Dw, which are doubled in case of multiplicity four) and of the source selection line (SSL.) Witch instead is single no matter what the multiplicity is. More in detail the selection bus of the drain lines associates the DSL_Up with the selection of the elemental group i (Sel_i) whereas the DSL_Dw associates the selection of the elemental group j (Sel_j). The solution of the block i&j is ensured by the control of the Block_bus.

The present scheme, compared to an analog decoding of a conventional NAND, against two elemental structures, employs a single control block and a single MUX (2 blocks and 2 MUXs for the conventional one) with a considerable savings of devices (four transistors for the rows, only one for the SSL). The combination of this simplification with the double height due to the pair of interested elemental structures makes the greater realization and area saving of the present memory evident.

Thus, in the end, the wiring of the Wl has inspired an advantageous simplification and a better implementation of the stimulus structures which however do not represent the only appreciable aspects of the memory device. In fact, by enhancing the parallelism of the Wl and reducing the number of the SSL, the bases are configured for a providential strap policy which importantly allows reducing the signal propagations of the Wl and, thus, to complete that improvement of the parameters which control the reading dynamics.

The described wiring suitably increases the space wherein the bypass connections can be produced with more conductivity but, unfortunately, more cumbersome and critical layers allowing fast propagations. The possible strap approaches will be described in greater detail hereafter.

The features explained up to now with reference to the memory device require a suitable theoretical support so that pragmatically the industrial feasibility thereof can be proposed.

In fact the features introduced have ended up by disrupting the traditional operating mode of a conventional Flash NAND memory.

In the first part of table 1 (TAB_1) of FIG. 9 the biasing conditions of a conventional Flash NAND memory in its functional activities are reported in detail. Descriptively, such functions can be summarized as follows:

Reading: in the selected sector all the Wl are maintained at logic level '1' (V_read) except for the Wl which identifies the cell to be read which is maintained at logic level '0'. All the Bl Even or Odd are read thus reading a big page (from 512_bytes to 2 k_bytes). The bank which is not the object of the reading is forced to Gnd for eliminating effects (disturbances) of adjacency between Bl.

Erasing: in the selected sector all the Wl are forced to Gnd, the Bl are left floating whereas the well substrate is raised up to the erase voltage (20 v). All the cells belonging to the sector made of a single stripe of NAND structures are erased.

Programming: in the selected sector all the WL are biased to 10 v whereas the Wl which identifies the cells to be programmed is subsequently raised up to the program voltage (1 v); the pattern is forced onto the Bl: those which are forced to Gnd are programmed, those which remain high are not programmed; the programming involves the entire bank Even or Odd; the Bl of the bank being not object of the programming are forced to a high level for protecting them from the spurious programmings.

All the lines being of a generic logic sector managed in an individual and independent way, no particular attentions have to be paid.

In the present memory device some functional activities need suitable adaptations so that the operability is ensured even in presence of significant modifications produced in the array (wiring of the Wl, new structure of the sector). However, for the reading and the erasing the functions at issue maintain themselves identically. For the sole erasing it to be specified that, the sector involving a numerosity of elemental structures equal to the multiplicity of the wiring, the whole multiplicity of structures will be erased. It is good to recall the attention also on the reduced size of the logic sector according to the memory device, advantageously, allows improving the erase granularity.

Figure 10:
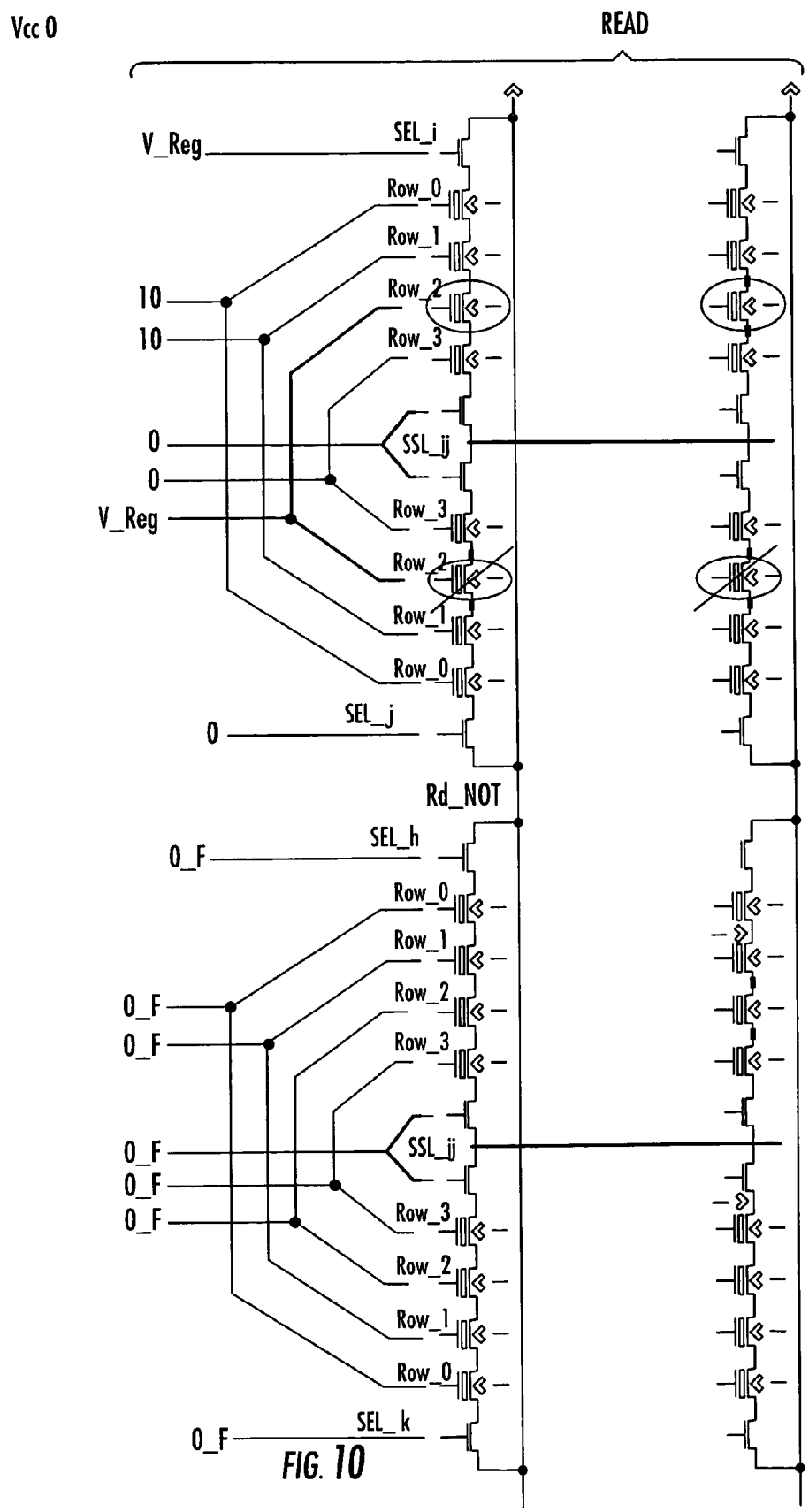
FIG. 10 shows a schematic view of the portion of FIG. 7 during the reading step of a memory cell.

FIG. 10 helps to understand what happens in the matrix during the reading step of a cell content. Substantially the reading step can be performed as in a NAND memory of the traditional type.

In this case an adjusted voltage value V_reg is applied both to the drain selector of the portion interested in the reading and to the word lines of the cell to be read. The exclusion from the reading of the cell which is on the short-circuited word line is ensured by the low potential value (0 V) on the selector SEL_j pertaining to such short-circuited word line.

Figure 11:
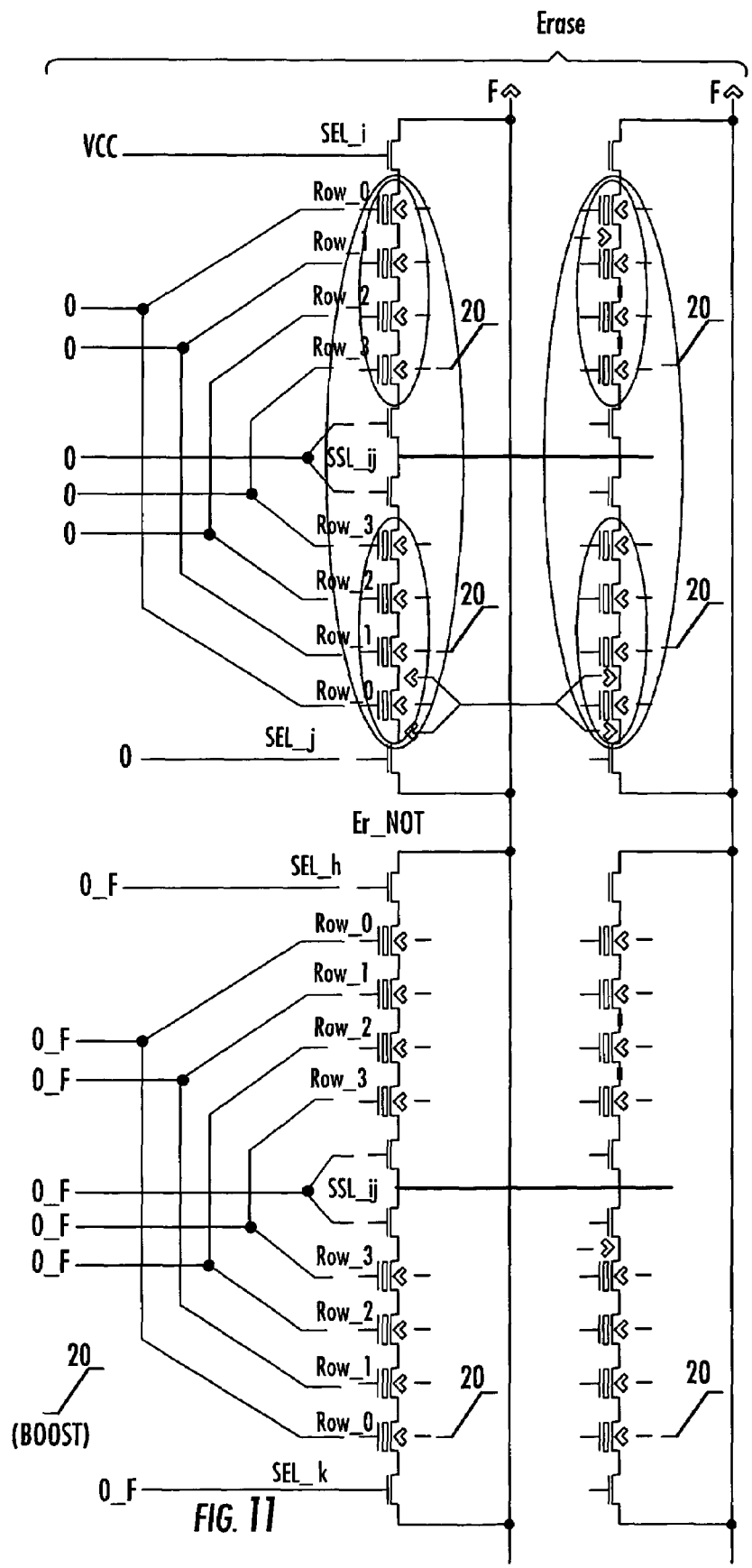
FIG. 11 shows a schematic view of the portion of FIG. 7 during the erasing step of a sector of the memory matrix.

In a completely analogous way it is possible to graphically follow what occurs in the erasing step making reference to the example of FIG. 11. In this case, as in the conventional approaches, it is possible to erase the cells content of an entire logic sector of the matrix by maintaining the potential floating on the bit lines and by applying a biasing voltage value equal to 0 V to all the word lines of the logic sector and by raising up the potential of the P-Well which physically contains the cells in the semiconductor substrate. The rows of the other logic sectors are instead maintained floating.

It is important to remember that in the architecture a logic sector comprises all the cells in wiring and not only those belonging to a single physical sector of a NAND structure, as it occurs instead in conventional contexts. In other words, a logic sector involves two, four . . . or other multiples on basis two packets or NAND physical sectors, in spite of a single packet.

The programming activity is instead more delicate. It is in fact known that the programming activity induces a significant amount of disturbances and cells which would not have to be modified are undesirably corrupted. The fields during the programming are high and where programming is not desired, the electrical stresses can be high and cause undesired variations.

For such reason, generally, the bank which is not the object of the programming is pre-charged at a suitable voltage. Such measure, facilitating dynamics of 'auto_boosting' in the pre-charged structures allows to contain and limit the effects of the disturbances: the fields in fact with the auto_boosting are reduced and they downsize the efficiency of the disturbances.

The problem of the programming disturbances would be even more stressing in the memory due to the plural selection of the word line which intercepts the cell to be programmed and to the need of excluding those which, although connected to the same word line, should not be programmed. To such purpose, following the example of the normal programming, so as to prevent dangerous operative contexts, before proceeding to the real programming step, an program inhibit condition is to be set by activating all the DSL lines containing the word line interested in the programming and forcing a contextual pre-charging of all the NAND structures of the logic sector. In this way a configuration is obtained with inert conditions of the nodes which do not belong to the modify activity, as it will be clear hereafter.

In the second step all the DSL lines non associated with the packet containing the cell in the modify step are deselected and the pattern to be programmed is simultaneously configured by forcing a potential of 0 V on the bit lines BL of the cells to be programmed and leaving instead the pre-charging potential on the cells whose content is not to be modified. The programming of the entire logic sector provides as many modify activities as much as the multiplicity of wiring of the logic sector and coordinate scan of the stimulation of the drain selection lines (DSL) are. During the whole program operation the line SSL is maintained at 0 V so as to avoid any path towards ground.

Making now reference to the example of FIG. 12, let's suppose that the cell to be programmed is in place on the second row ROW_2 and on the column or bit line interested in the program pulse Pg. As well highlighted in FIG. 12, the program pulse provides a potential of 0 Volt on the bit line of the cell to be programmed, whereas the adjacent bit lines are interested in a biasing at the supply voltage Vcc which excludes the possibility of programming thereof.

Further to the structural modification provided by the present memory device, two rows of the matrix logic sector are biased with the program voltage relatively high value (18 V). However, the lower row associated with the row ROW_2 which is to be programmed is excluded simply by maintaining a potential of 0 V on the drain selector SEL_j of relevance. With this the relative intercepted and pre-charged sectors are left in the inhibit condition. This occurs also for the selectors SEL_h and SEL_k of the logic sector which is not to be programmed.

On the diagram of the timed signals of FIG. 13 it is worth noting that the real programming step occurs in two stages or two steps. A first step provides the program inhibition with the drain selection signal raising up to the supply value Vcc both for the higher selector and for the lower one, and with the relative channel pre-charging.

At a second stage, the biasing of the upper selector is maintained at logic level '1' whereas that of the lower selector is brought to logic level '0' protecting the pre-charge of the underlying structure. Simultaneously the word line is enhanced to 18 V realizing the real programming. This fact allows adjusting the program timing so that in spite of the fact that the word lines are short-circuited the incidence of the disturbances are however limited.

The biasing values of the various nodes under the different operative conditions are collected in FIG. 9 in a comparative way with the conventional approach. In the same table of FIG. 9 also the management conditions relative to the wiring of the lines SSL only are shown.

Therefore, the present invention also relates to a programming method of the memory device 20 which provides that each programming step of one or more cells in parallel is preceded by an inhibition step of the programming obtained by activating all the drain selection lines DSL containing the word line or lines interested in the programming and forcing a simultaneous pre-charging of all the channels of the cells of a given logic sector. A subsequent programming step provides deselecting all of the drain selection lines DSL not associated with the packet containing the cell in the modify step.

Moreover, the pattern to be programmed is simultaneously configured by forcing a potential of 0 V on the bit line BL of the cells to be programmed maintaining the pre-charging potential on the channels of the cells whose content should not be modified.

Pairs of drain selectors are provided according to the multiplicity for each logic sector. Differently, only one control terminal is necessary for the different source selectors of a generic logic sector since the same, being wired, are simultaneously stimulated without causing malfunctions. Among the different stimulated source selectors only the one aligned with the selected drain will be active.

The source selector of a logic sector is distinct from the corresponding source selectors of other logic sectors.

With equal memory sizes, a logic sector of the matrix corresponds to at least one pair of physical sectors of a matrix with NAND architecture of the traditional type. With the architecture the array is more easily retraceable and equally functional with respect to a traditional NAND architecture.

It is also important to note that for reducing the word line access time, which is one of the main parameters concurring to the read and program performance of the memory, it has been thought to implement a strap technique. Already used in other types of non-volatile memory the strap would be an excellent approach for reducing the propagation times of the Wl but, at present, it is impossible to implement it in a conventional Flash NAND memory: the space available for technically performing it is too small.

In fact, a conventional NAND memory has the cells of so reduced in size that only word lines are admitted having a minimum pitch being so small as to make the implementation of a technologically complex technique such as the strap physically impossible. For realizing a strap, in fact, it is necessary to have sufficient spaces as to effect contacts and prepare bypass paths with less resistive layers, such as metal. These latter are, however, technologically more cumbersome and they need wide 'passageways' for developing themselves: widely exceeding the pitch of the Wl (much more reduced) their implementation is substantially impossible.

Moreover, a conventional Flash NAND, has the peculiarity of having all independent control lines (Wl, DSL and SSL) whose high number would impede the same large number of shunts necessary to perform a strap. As a matter of fact the number further exasperates its difficulty. The combination of the two features (greater space of each line and high number of the same) is an insurmountable hurdle towards any strap mode.

Figure 15:
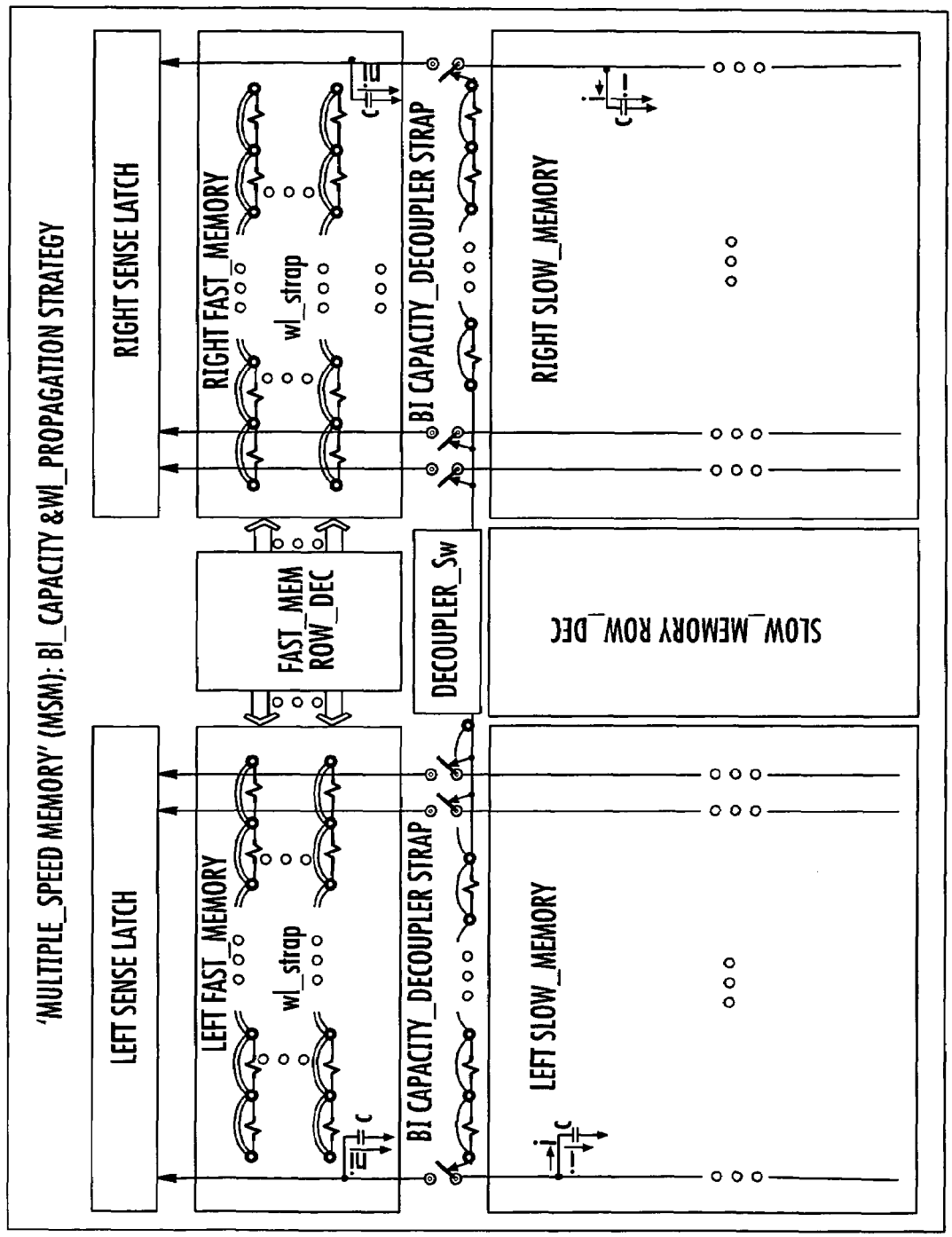
FIG. 15 shows a schematic view of the device of FIG. 3 wherein the fluidification technique of the propagations according to the WL by way of the metal strap on the word lines of the fast memory portion is highlighted.

However, thanks to the introduction of the innovative method of the row selection, as previously shown in the descriptive part pertaining to the wired word lines, thus thanks to the possibility of simultaneously selecting two or more rows and the coordinate melting of the SSL in a single line, the implementation of the strap can be not only realized as shown in FIG. 15 but also leads to obtain word line propagation delays comparable, if not even lower than a traditional NOR architecture. Considering a wiring of multiplicity two, it has been said, that two elemental structures are involved each involving 4 cells NV. In this context, against a number of 12 necessary independent lines with a conventional management, only 7 (4_Wl+2_DSL+1_SSL) are needed with the wiring technique (FIG. 6).

Similarly, considering a wiring of multiplicity four in place of the 24 conventional lines only 9 (4_WL+4_DSL+1_SSL) are needed (FIG. 8), a remarkably lower number which frees a more than sufficient space for the execution of the strap. Therefore it has been possible to devise an advantageous strap technique by acting on three basic elements:

Incorporation of more elemental structures in a single sector;

wiring of all the homonymous lines of the elemental structures;

combination in a single selection line for the SSL for each logic sector.

The force of the three concepts allowed by the new functional strategy has been expressed, thus, resulting in a great reduction of the number of independent lines necessary for the management of the single logic sectors. Therefore, the number of the shunt lines which make the strap is definitely downsized permitting the feasibility thereof without losing the minimal size of the cells (indispensable condition to maintain the greatest compactness of the memory).

Figure 16:
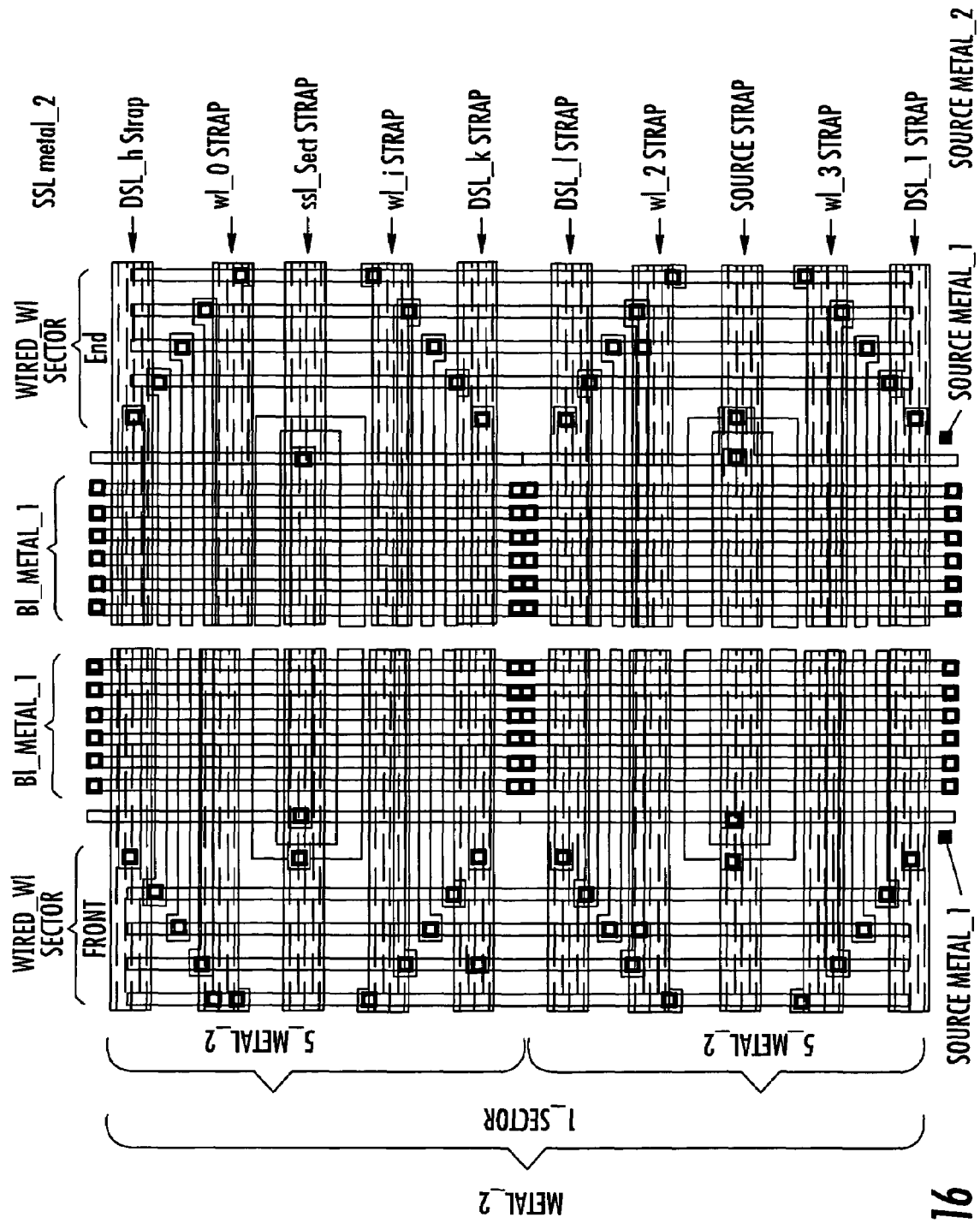
FIGS. 16 and 17A and 17B show respective schematic views of an embodiment of strap techniques for the device according to the invention.

The orchestration of the three explained concepts, which does not modify, as it has been seen, the functional features of the memory, has made the processing of the different strap typologies possible:

1. Border strap (example FIGS. 16, 17A)
2. Full middle strap (example FIGS. 17B, 18B, 20B)
3. Partial middle strap (example FIG. 20A)
4. Distributed middle strap (example FIG. 19)

Hereinafter the different types of straps are specified and shown in the annexed Figures which make reference to the realization of straps in sectors mainly having multiplicity of wiring 2 o 4;

'border_strap': it is an edge wiring characterized by strap contacts between homonymous lines carried out with 'scalar' technique; this in order to have the space necessary for their execution. The shorts between the homonymous lines are realized in metal_1 whereas the straps are realized in metal_2.

'Full middle strap': it is a 'complete wiring' inside an array which realizes the strap ensuring the continuity between homonymous lines of consecutive blocks. The shorts between the homonymous lines belonging to different elemental structures are realized in metal_1 whereas the straps are realized in metal_2 and the continuity between the lines of adjacent blocks is maintained via poly_2.

'Partial middle strap' is a middle strap limited to some lines, carried out in more different combinations: less cumbersome than the corresponding 'Full' it has the purpose of being 'transparent' as the occupied space inside the array.

'Distributed middle strap' is the sum of all the 'partial middle straps' which, in succession and in a distributed way, realize one or more complete straps with the feature of a propagation at one fast and transparent as occupied space.

For each pair of blocks sharing the same drain contact common word-lines with relative shunts in metal 2 in the middle of each sub matrix are provided.

In substance, for pairs of matrix sectors sharing a same drain contact common word-lines are provided with relative metallization shunts in the middle of each sub matrix.

Figure 18A:
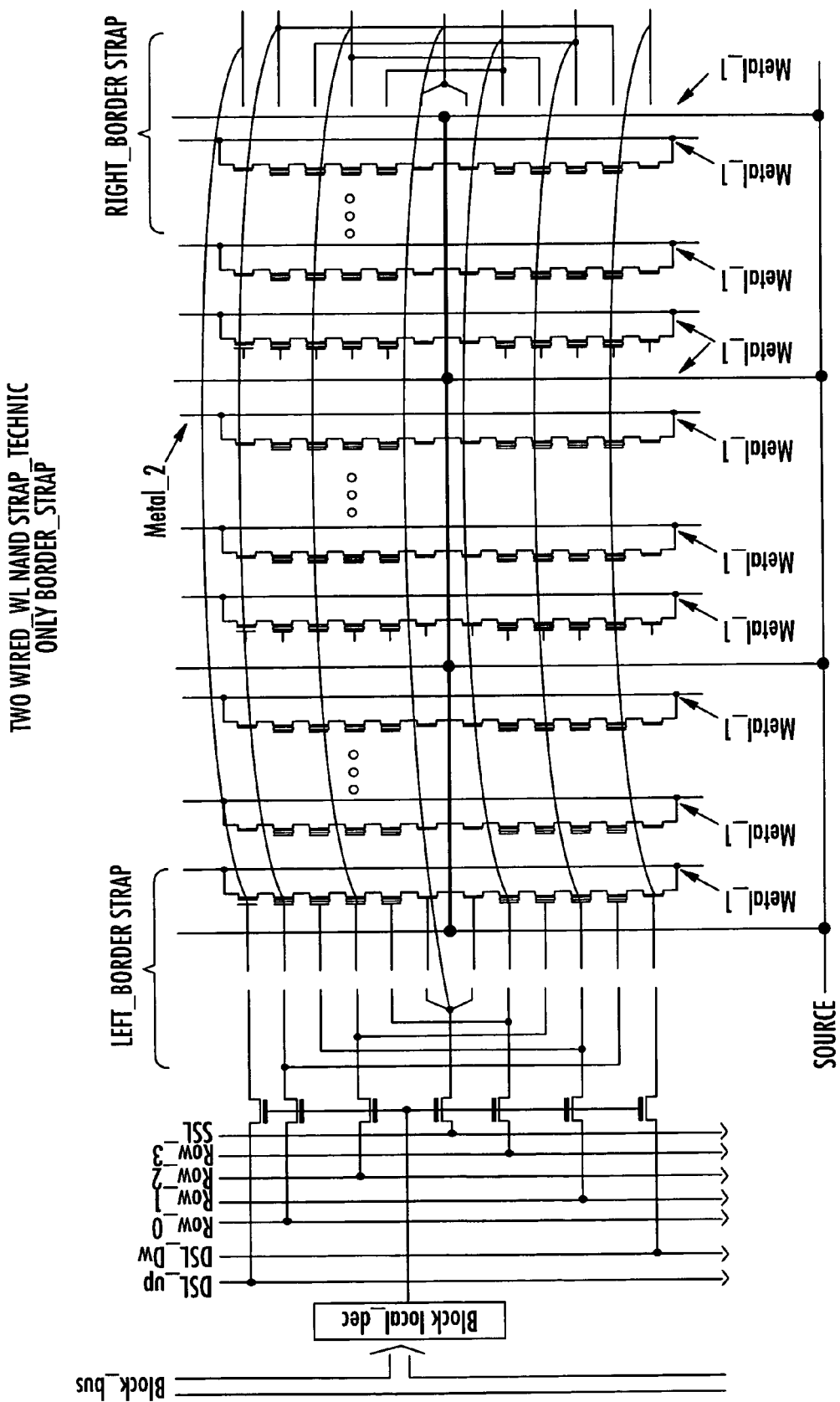
FIG. 18A shows a schematic view of a possible edge strap technique for the device of the present invention.

The same source SSL selectors are short-circuited, whereas the effective selection of the cell exclusively occurs by way of a drain selector, as shown for example in FIG. 18 in "full middle strap" mode.

As a general rule, one strap per sub matrix could be enough; however, analyzing the structure of a typical NAND array more in detail it is observed that vertical ground lines in metal1 each 128 bit lines and vertical bias of P-well each 512 bit lines are provided. In other words, vertical ground lines in metallization of first level each 128 bit lines and vertical bias of P-well each 512 bit lines are provided.

Considering the great number of p-well bias existing in a typical NAND array, and thus the possibility of adding different strap points, the propagation times are so reduced as to be comparable if not even lower than those of a corresponding Flash NOR (i.e. <20 nsec). This approach is contemplated in the examples of FIGS. 19 and 20.

A full strap would imply a greater space than the distributed strap and it would be advantageous only in the case wherein it is realized at the extremes, i.e. with the contacts at the edges of the device. A distributed strap can instead be repeated more times at zero cost and it also allows a drastic reduction of the word line propagations.

The strap provided in the present device is compatible with all the memory user mode operations, in particular the read and program steps are the same with respect to a structure without strap.

As regards instead the erase operation, the execution granularity of the same doubles with respect to the elemental structures since it is not possible to distinguish a structure inside a pair. This however does not penalize the memory's general performance since it exclusively relates to the code portion which has a higher granularity with respect to the data portion.

Figure 17A:
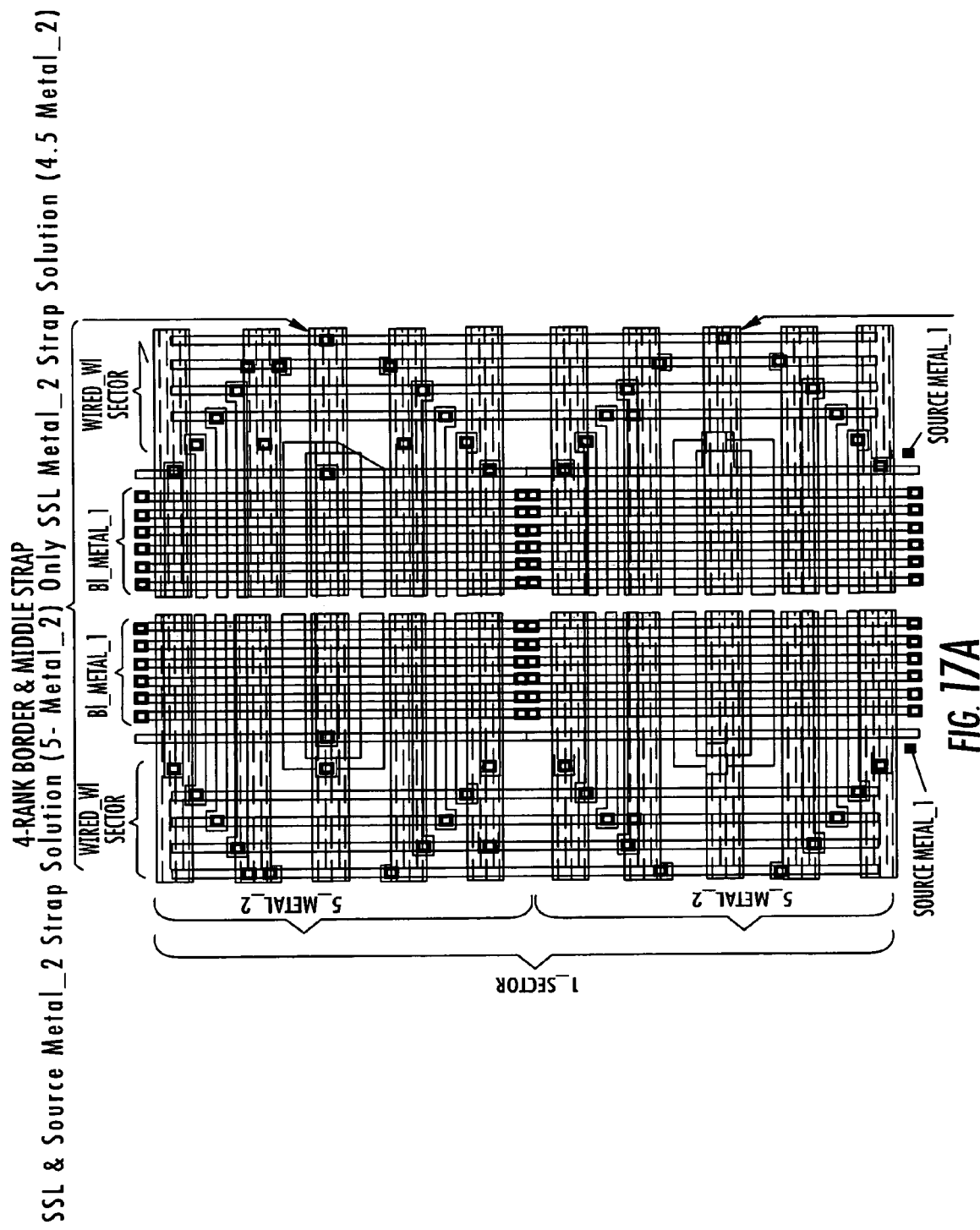
Figure 17B:
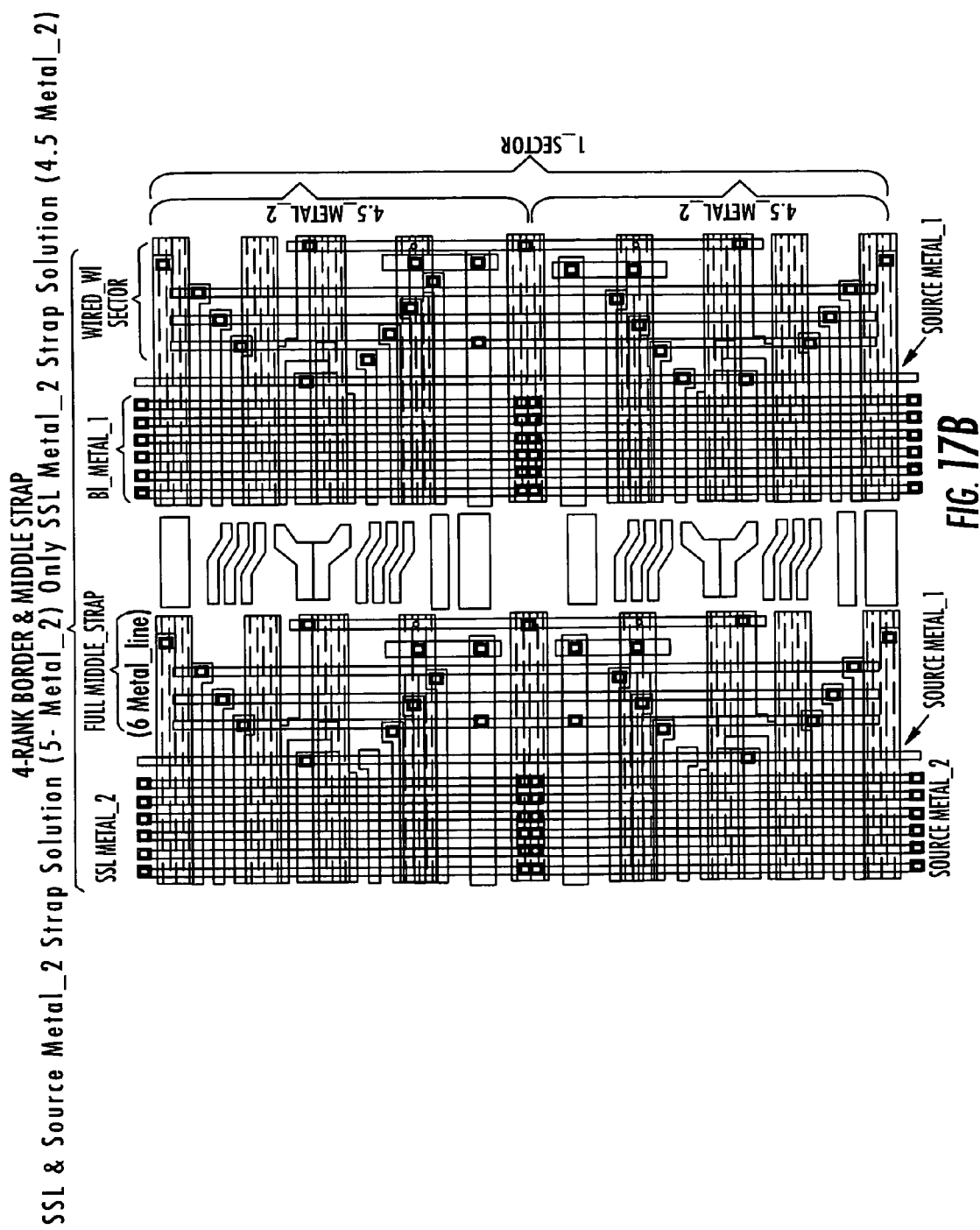
Figure 18B:
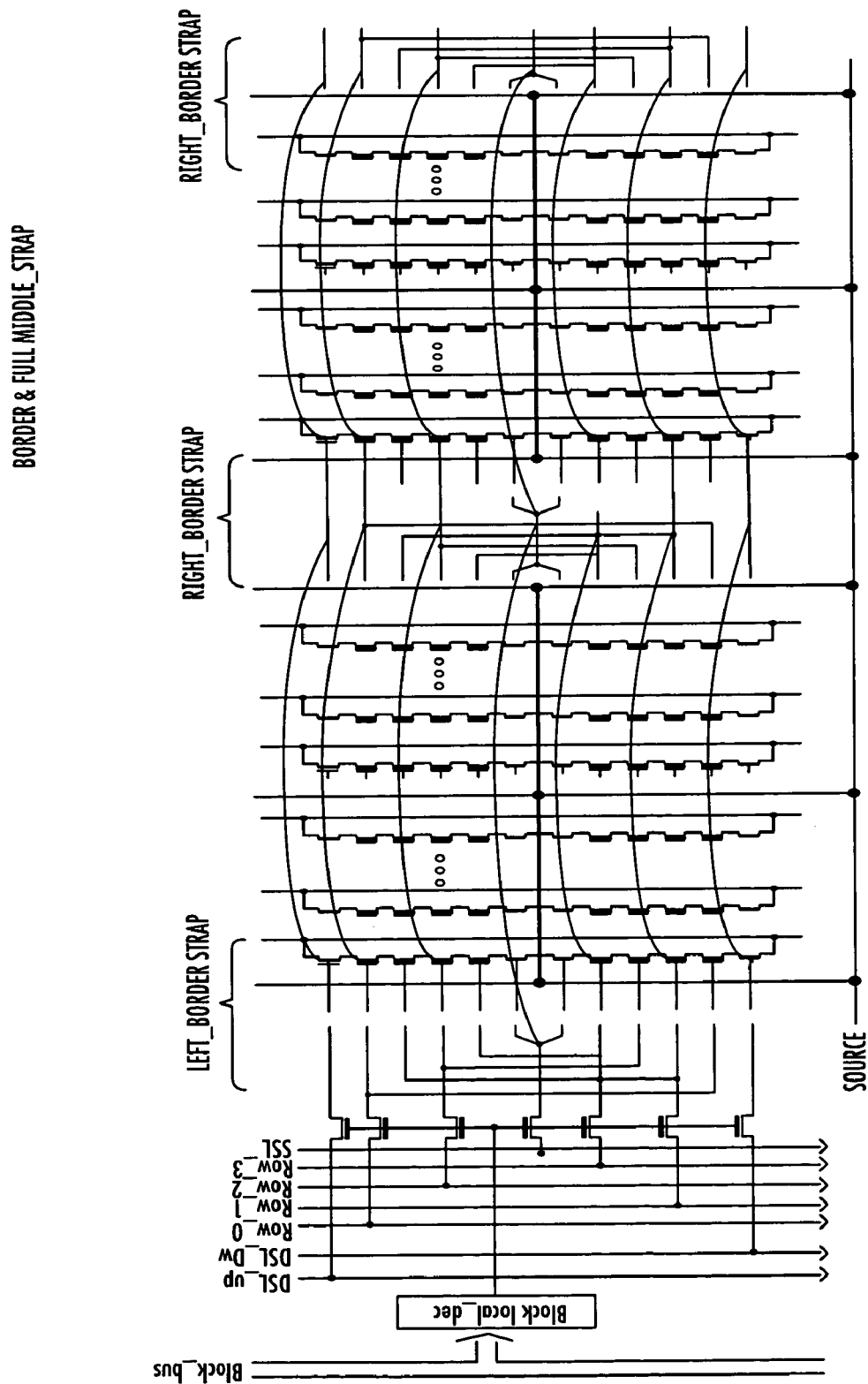
FIG. 18B shows a schematic view of a possible edge strap and of full middle strap technique for the device of the present invention.
Figure 27:
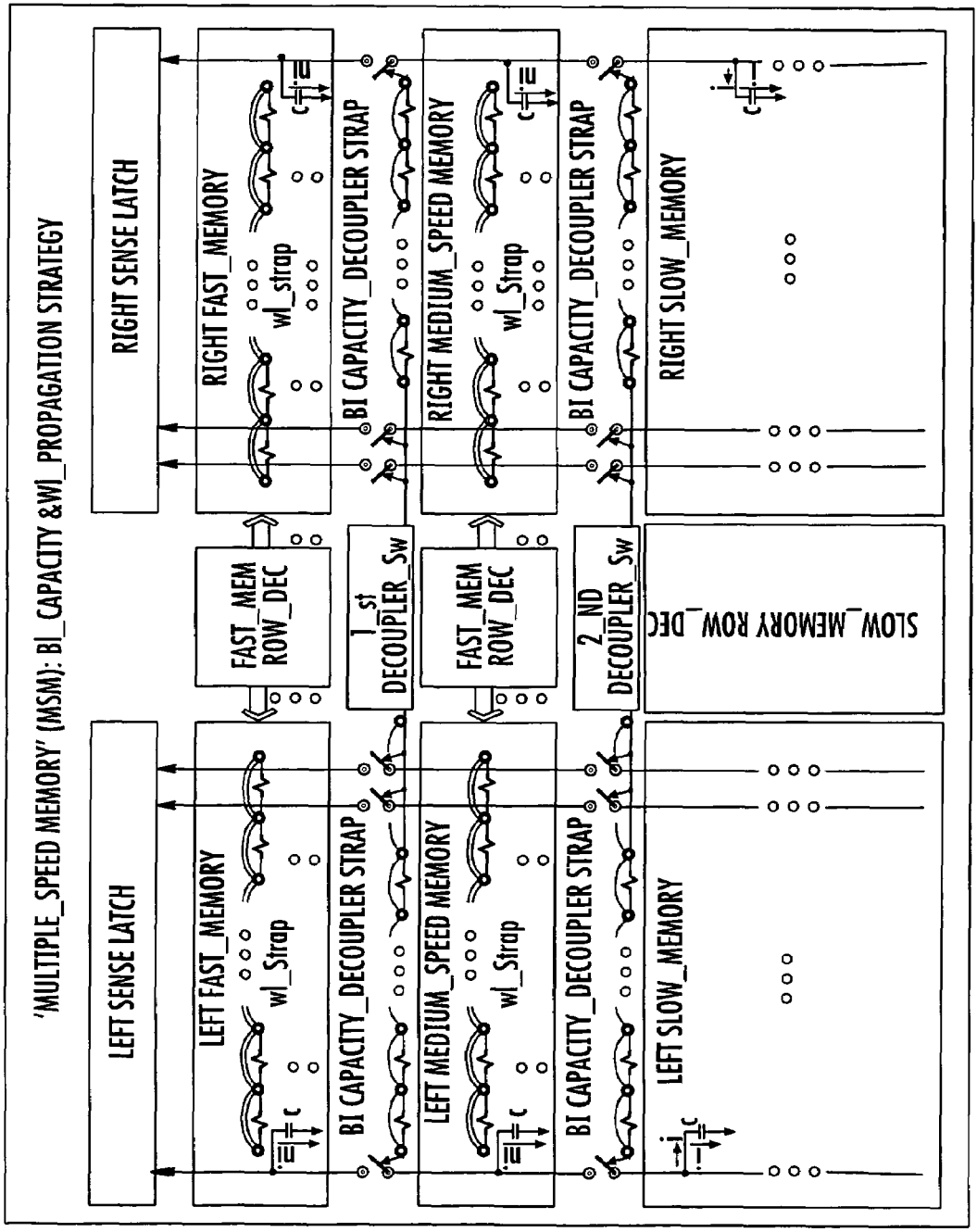

It is possible to further relax the pitch of the strap lines in metal_2 by repeating the exposed method to two or more pairs of blocks, for example as shown in the FIGS. 17A, 17B, 21 for the case of 2 pairs.

Figure 22:
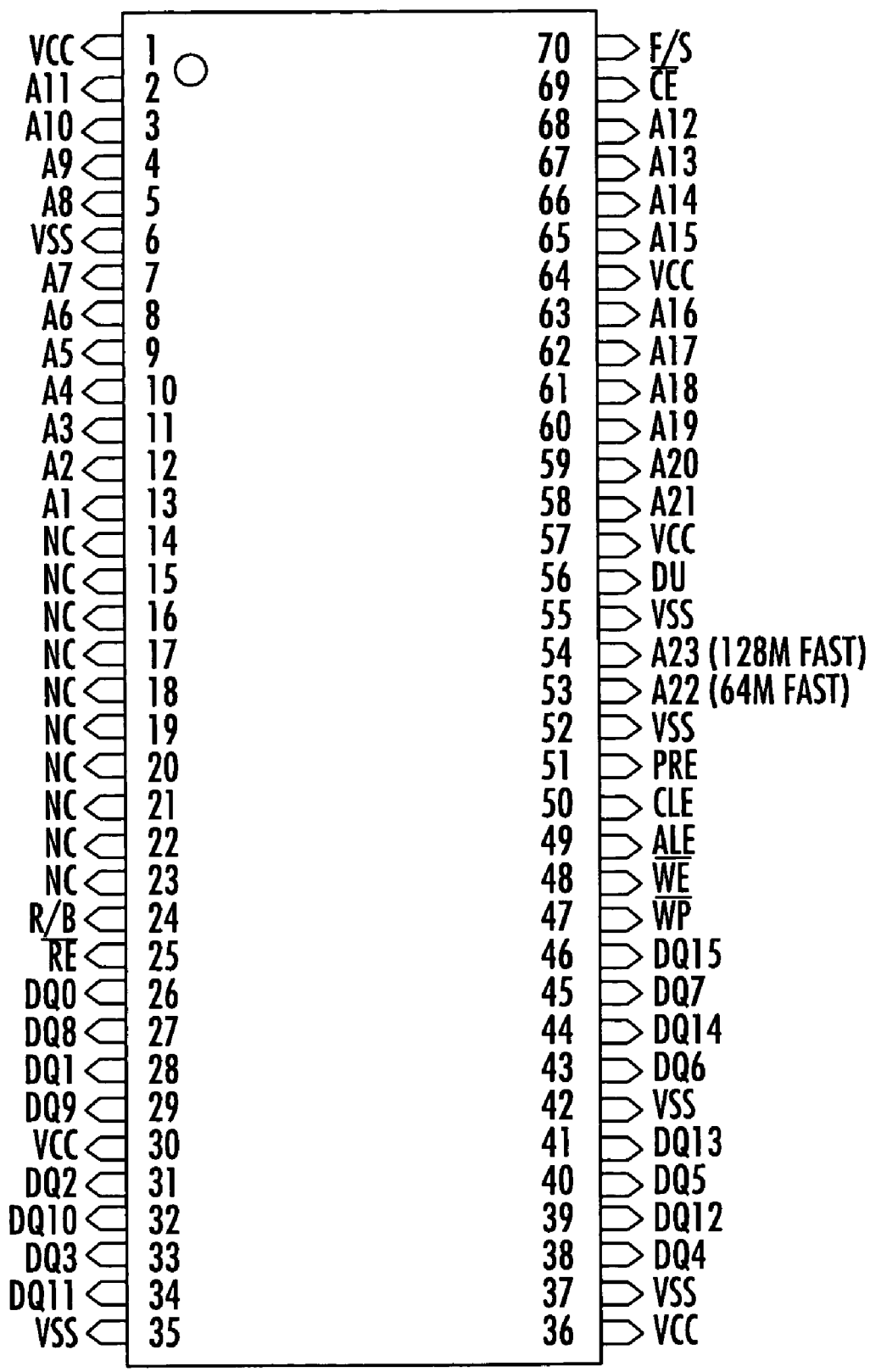
FIG. 22 shows a schematic view of semiconductor package inherent in the memory device of FIG. 2 wherein the main input/output pins are highlighted.
Figure 23:
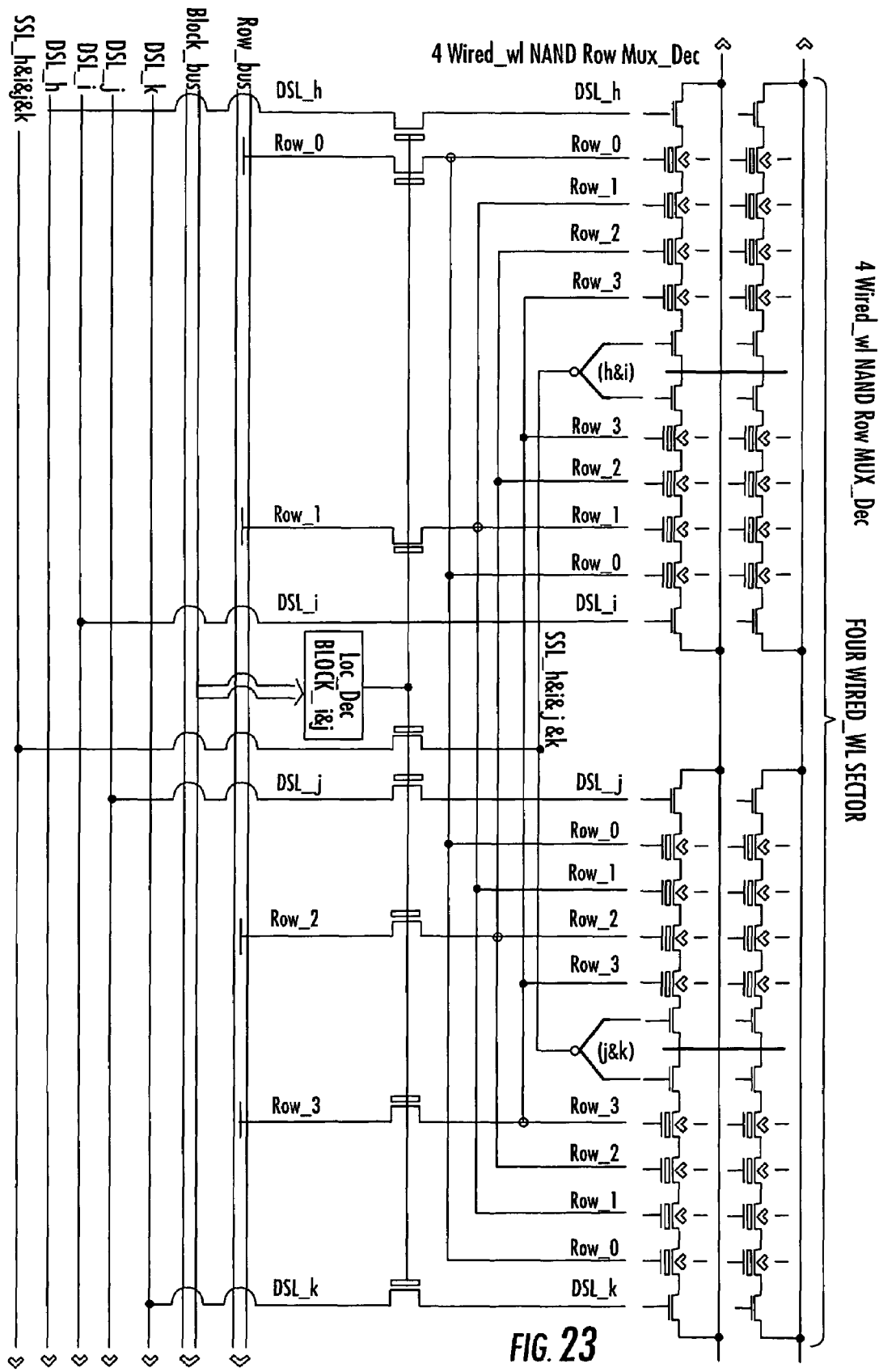
FIG. 23 shows a more detailed schematic view of an embodiment of the fast matrix portion in accordance with the invention.
Figure 24:
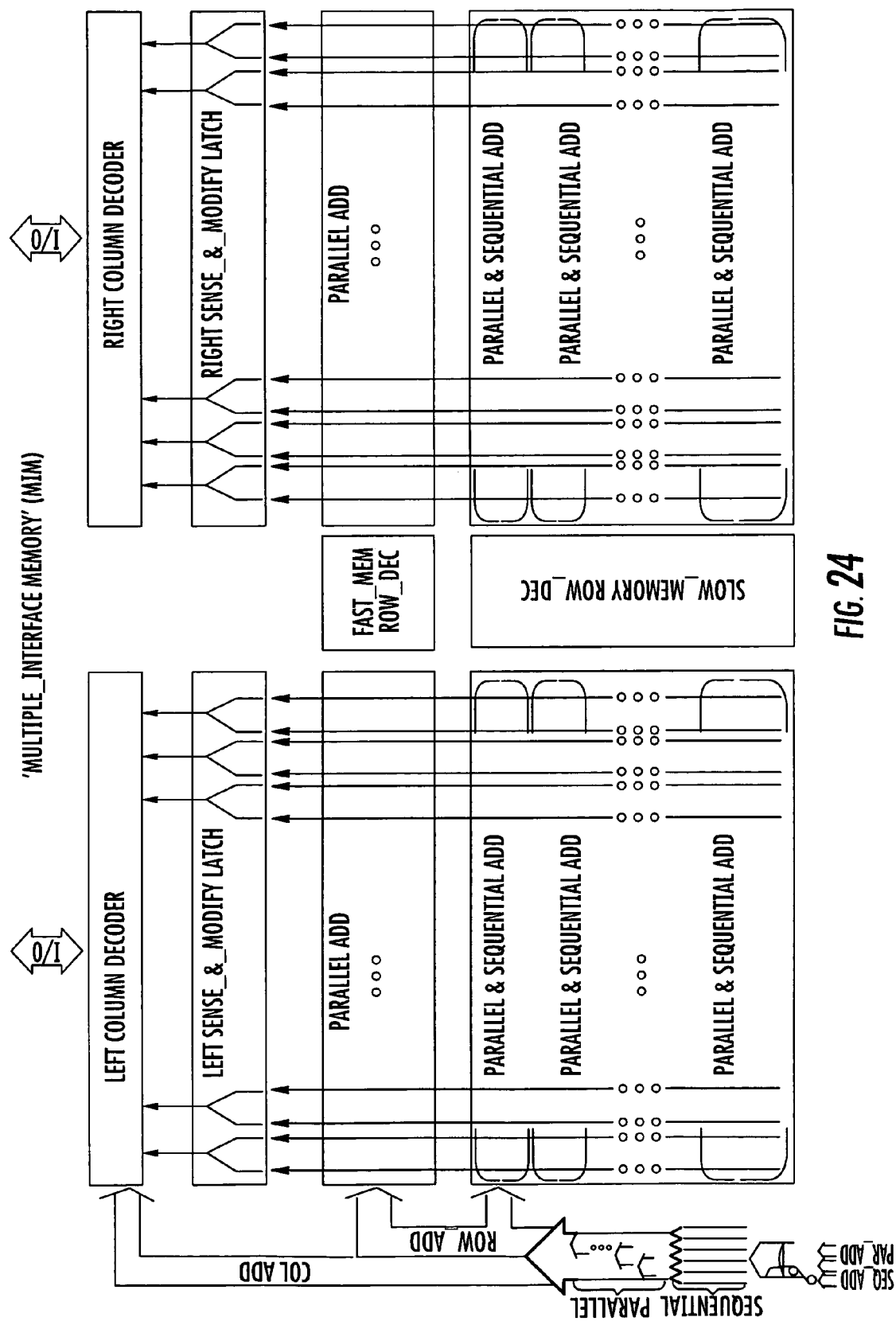
FIG. 24 shows a schematic example of how an increase of conductivity of the elemental AND structures of the fast matrix portion is achieved by operating parallelisms of word lines on the basis of two or on the basis of four in accordance with the invention.

If, in this regard, it is to be highlighted that the described strap technique is easily applicable to the data memorization portion (>=16 cells, as shown in FIGS. 22 and 23). FIG. 23, in fact, shows an advantageous realization of border_strap which can be easily implemented at the matrix edges (but it could be thought also only at the 'front'): with this the propagation reduces to ¼ of the traditional one. The contacting does not suffer from particular difficulties since, with scalar approach the swells of the contacts do not meet difficulties to be carried out and the strap lines are perfectly feasible: only 19 lines (16_row+2_DSL+1_SSL) in place of 36.

The access time of the code portion thus refers to a random access time typical of the memories used for running a software without the use of RAM (XIP Flash), i.e. <100 nsec.

The here adopted approach allows reducing in a significant way the word line delay partially responsible for the limited performances of the NAND architectures in reading. Moreover, thanks to this measure the implementation of strap techniques is possible, such techniques allowing the significant reduction of the propagations indispensable for the attainment of the high performances.

The previous example of array sizing in the Figure is reported only by way of example of the proposed idea and it does not exhausts all the possible combinations.

Among the other advantages offered by the wired word lines approach is that of allowing the freeing of wide spaces for the implementation of the row decoding of a non-volatile memory with sub-micrometric lithography, in particular it is especially suitable for use in NAND architectures, eliminating criticality or extreme fragmentations of the row decoding networks.

The principles of the present memory device are easily extendible in the case wherein it is necessary to provide plural memory portions having different access speed and data storage capacity, all however being part of a same integrated electronic device.

For example FIG. 24 schematically shows how a device can be organized with a slow matrix portion, a fast portion and an intermediate portion having a speed, in turn, intermediate between the two preceding ones. In this case, it is enough to provide two functional interruptions of the bit lines with interposition of associated pass transistors.

Advantageously, the portions 23 and 23a, respectively slow and fast, of the non-volatile memory cell matrix 22, communicate with the respective interfaces by way of a communication protocol which manages the entire memory device 20 integrating the "hard disk" and boot/code ROM functions.

The device thus exhibits very different functional/performance aspects with respect to the products of the traditional flash_NAND type. In fact the memory incorporates slow functional parts, other fast and both enhanced by further improvements which involve both flexibility aspects (addressing multiplicity), and of immediacy (possibility of random access both onto the entire memory and into any data array).

These new potentialities, for a better explanation thereof, have suggested an enriched stimulus interface (Pin_Out), with respect to a traditional Flash_NAND, with a further address bus and an associated enable pin PA (paralle_Address). The new addressing structure adjacent to that typical of the traditional Flash_NAND has produced a new communication protocol.

Such protocol has been developed in such a way as to respect those features which optimize the performances of the device in terms of flexibility and compatibility, in particular:

compatibility with the conventional NAND protocol for the read and modify operations (program and erase);

random access of the NOR-like type for any sufficiently wide portion of the memory;

speed in the refresh operations of the whole memory;

binary number of the address pins;

address register charged in a single clock pulse;

invariance of the address system/bus with respect to the memory sizes;

synchronous reading in the random mode;

addressing mode of the "address bus free" type;

switchings between the various operating modes of the "command free" type;

control signals of the NAND protocol;

a single control signal for switching between the various modes; and the single non-parallel read mode is by default the NAND one.

For completely exploiting the intrinsic potentialities of the architecture a suitable reading method is to be defined which can be as flexible as to pass from an operation mode to the other without resorting to burdensome and slow commands. In this way the memory device 20 acts, for a processor with which it normally interacts, really as a single complex and integrated system of data, codes, information and base commands for the operative system storage.

The various memory portions 23, 24 and 23a, 24a have been designed and organized so as to be read indifferently with all the modes, except for the different operation speed which depends instead on the matrix portion which is to be addressed.

The above mentioned features will be clearer from the following description. By comparing the approach of the memory device with the known approaches, for example with the NAND memory of FIG. 1, it can be appreciated how such known memory device comprises a certain number (sixteen) of address pins and outputs (sixteen).

Both NAND architectures, for example: CL, AL, PR etc. . . ., and NOR (W) architectures are also provided with traditional common control pins.

The addressing window equal to sixteen has been traditionally adopted for obtaining an efficient partitioning of the memory in terms of blocks, sectors and sub-sectors, and in such a way that the signals can move inside the memory with simple and "identifiable" loadings of the address registers respectively corresponding to the block, to the sector and to the selected sub-sector. The memory device 20 is capable of performances in reading of about ~100 nsec., which are typical of a NOR memory. Moreover, such device 20 keeps the writing/erasing and, in general, modify performances of a typical NAND memory for data storage.

To meet these multiple needs a specific control pin has been provided, shown in FIG. 25 and indicated with the acronym PA, which allows passing from a mode of the data storage type to a mode of the XIP type with a simple switch "0->1", or "1->0" in the opposed case. All this without the need of using added clock and wait cycles of the microprocessor which interacts with the memory.

It is worth noting that the data storage mode makes use only of the traditional NAND protocol of the synchronous type and it is essentially addressed to the use of the memory as data/files storage. In this case the control pin PA is kept at the logic level "0".

The device 20 can also however operate in the parallel access mode. These modes are all referred to the device operation with the pin PA kept at the logic level "1". Three main modes can be identified, whose waveforms associated with the signals applied to the device pins are reported in FIG. 26. As it can be easily noted, the first two modes do not require any multiplexing of the addresses in the output pins, as instead occurs in the traditional NAND architectures.

The first one of these two protocols is of the asynchronous type and it essentially corresponds to a classical asynchronous protocol which allows addressing up to 1 Mbit of memory at a speed depending on the features of the selected array portion, for example 100 nsec for the part of the NOR-like type and 20 usec for the NAND part.

The second protocol is of the extended type and with the addition of a single clock pulse it allows addressing up to 64 Gbit by way of the loading of an address register with 32 bit in two successive instants (16+16), thus the reading of a generic data at a speed depending on the array region wherein one is, for example 100 nsec+clock for the NOR-like part, equivalent to ~120 nsec. In both the first two protocols the outputs are free to switch in the state corresponding to the desired operation and/or cell.

A third protocol, called "maxi", makes use, by way of a multiplexing operation, of the output pins also used for the NAND protocol to address up to a maximum of 16 Tbit. In two successive instants the address m (middle) part and the address M part (most, with 8 bits) are respectively loaded by way of the address buffer and by way of the first output pins <0:7>, afterwards with a clock pulse on the pin AL the register 1 (least, with 16 bits) is loaded by way of the address pins and the reading is made start with a speed equal to that of the second protocol. The third protocol is functionally distinguished from the first two exactly for the use of the pin AL which is intended for the definition of the latching operation of the addresses by way of the output pins.

Hereafter the main features of the reading step are summarized:

portion 23a NOR-like tacc: max 100 nsec random, without limits; 30 nsec burst & random (in page); and portion 23 NAND tacc: max 20 usec random, without limits 30 nsec burst & random (in page).

All the memory modify operations make use of the traditional protocol used in the NAND architectures and therefore they are not detailed in the description.

Let's now consider an example of the operation of the device. Suppose that at the switching on step of a mobile electronic device (cellular, palmtop, camera, etc. . . . ) Witch incorporates the memory device according to the invention the content of a part IPL (Initial Program Loader) and of a second part SPL (Secondary Program Loader) of the mobile BIOS should be loaded in a first 1 Mbit portion of the non-volatile memory matrix object of the present invention.

Such first 1 Mbit portion of program instructions have the peculiarity of allowing a quick access to the cells.

At the start up of the mobile device a reading of the memory is thus performed in the first 1 Mbit locations (FIG. 5), since the address registers (32 or 40 according to the architecture) are: as regards the least part connected directly to the 16 external address pins, as for the middle (and most) parts to zero and reset by the power on reset signal. The reading of these cells occurs at a speed of 100 nsec. The response speed of the device is thus similar to that required by these boot operations and thus it does not need RAM loading.

In contrast to the most developed existing wireless memory devices, all the read operations performed with the protocol used in the memory do not require additional commands such as, for example, the "load" of a RAM of normally smaller sizes than the smallest random addressable portion of the memory device (32 Kbit with respect to 1 Mbit).

Further important advantage of the described protocol is its flexibility, since it allows the memory reading both with a conventional approach of the NAND type and with an efficient random approach so as to speed up the responses of the fastest portions (portion 23a NOR-like, page buffer).

Moreover the passage from a mode to the other occurs without complicated wait cycles, but as function of a single control pin (PA) and it is thus immediate.

In conclusion, the memory device allows realizing in a single chip, thus using a single technology, a group of functions up to now could be obtained only by associating memory chips realized and structured with different technologies.

Everything is obtained with a slight modification of the NAND memory matrix and it allows the use of a flash NAND structure, substantially substituting a RAM or a ROM, for the start up step.

From another point of view, the memory and associated method allows making an intimately slow NAND structure with random access. Globally the device and the method attain a rich series of advantages listed hereafter:

Reduced costs and low circuit complexity;
Memory areas (higher or equal to two) at different operative speeds, which can be selected by way of row decoding;
Memory areas with at least a full random access part, substantially with NOR modes;
A memory portion which can be used as data storage of greater capacity with respect to the portion apt to the code storage;
NAND protocol for the sectors used for the data and full random access for the part apt to the code XIP;
It makes a RAM unnecessary to execute the code;
Low assembling costs with respect to known approaches of Toshiba/Samsung;
Low costs for the user in the case of use of extra chip RAM;
Full technological compatibility with other associated NAND circuits, for example for the realization of memory parts with NOR random access;
Reduction of the capacitive loading of the bit lines by way of decouplers; and
Continuity and sharing of the structures of the NAND areas at different speed.

Additional features of the invention may be found in co-pending applications entitled; NON-VOLATILE ELECTRONIC DEVICE WITH NAND STRUCTURE BEING MONOLITHICALLY INTEGRATED ON SEMICONDUCTOR, Application Ser. No. 11/279,381; AN INTEGRATED ELECTRONIC NON-VOLATILE MEMORY DEVICE HAVING NAND STRUCTURE, Application Ser. No. 11/279,384; and NON-VOLATILE MEMORY ELECTRONIC DEVICE WITH NAND STRUCTURE BEING MONOLITHICALLY INTEGRATED ON SEMICONDUCTOR, Application Ser. No. 11/279,385, the entire disclosures of which are hereby incorporated herein by reference.

That which is claimed is:

1. A non-volatile memory electronic device integrated on semiconductor with an architecture comprising: at least one memory matrix organized in word lines and bit lines of memory cells, said at least one memory matrix being divided into at least first and second memory portions having different access speeds, said at least first and second memory portions sharing the bit lines which correspond to one another and are electrically interrupted by controlled switches placed between said at least first and second memory portions.

2. The non-volatile memory electronic device according to claim 1, wherein the memory cells of said first memory portion have a different conductivity with respect to the memory cells of said second memory portion.

3. The non-volatile memory electronic device according to claim 1, wherein said first and second memory portions are selected independently from one another and each being selected with a respective access mode.

4. The non-volatile memory electronic device according to claim 1, wherein said first and second memory portions also share associated read, program and erase circuit portions.

5. The non-volatile memory electronic device according to claim 1, wherein said first and second memory portions maintain the same protocol and operative management procedures although tolerating different propagation and conductivity times in the two portions.

6. The non-volatile memory electronic device according to claim 1, wherein respective decoding circuit structures are associated with said first and second memory portions.

7. The non-volatile memory electronic device according to claim 1, wherein said second memory portion is placed immediately close to the modify and read structures of the device.

8. The non-volatile memory electronic device according to claim 1, wherein the bit lines belonging respectively to said first and second memory portions have sizes and capacitive weights different from one another.

9. The non-volatile memory electronic device according to claim 1, wherein the bit lines of said first memory portion are longer than the bit lines of said second memory portion and have a higher capacity with respect to the bit lines of said second memory portion.

10. The non-volatile memory electronic device according to claim 1, wherein said second memory portion is smaller than said first memory portion.

11. The non-volatile memory electronic device according to claim 1, wherein said at least one memory matrix is of the Flash EEPROM type with a NAND architecture and said second memory portion operates with access times comparable to memory architectures of the NOR type.

12. The non-volatile memory electronic device according to claim 1, wherein the decoupling is obtained by controlled switches comprising pass transistors of the N-channel type or bank selectors.

13. The non-volatile memory electronic device according to claim 1, wherein the memory cells with which the second memory portion are constructed have the same electrical characteristics as the memory cells of the first memory portion cells.

14. The non-volatile memory electronic device according to claim 12, wherein said controlled switches are activated by forcing a high logic value on their control terminals and deactivated by forcing a low logic value on their control terminals.

15. The non-volatile memory electronic device according to claim 1, wherein said controlled switches are activated or deactivated in parallel.

16. The non-volatile memory electronic device according to claim 1, wherein only the controlled switches are deactivated while the second memory portion maintains the connection with the read and modify structures.

17. The non-volatile memory electronic device according to claim 1, wherein the controlled switches are deactivated and a load of a generic bit line is defined by a capacity relative to the sole bit line of the second memory portion.

18. The non-volatile memory electronic device according to claim 1, wherein each read or modify operation conducted on the second memory portion is based on a deactivation of the controlled switches, and each read or modify operation conducted on the first memory portion is based on an activation of the controlled switches.

19. The non-volatile memory electronic device according to claim 1, wherein the memory cells of both of said first and second memory portions are formed using the same technology.

20. The non-volatile memory electronic device according to claim 1, wherein the memory cells in which the second memory portion is constructed are read, programmed and erased with the same modes as those of the memory cells of the first memory portion.

21. A non-volatile memory comprising:
a semiconductor substrate;
at least one memory matrix on said semiconductor substrate and comprising a plurality of memory cells organized in rows and columns;
a plurality of word lines coupled to the rows of said plurality of memory cells;
a plurality of bit lines coupled to the columns of said plurality of memory cells;
said at least one memory matrix divided into at least one first memory portion and at least one second memory portion, said first and second memory portions having different access speeds and sharing said plurality of bit lines; and
at least one switch between said at least one first and second memory portions for electrically interrupting said plurality of bit lines for selecting said at least one first or second memory portion.

22. The non-volatile memory according to claim 21, wherein memory cells in said at least one first memory portion have a conductivity that is different than a conductivity of memory cells in said at least one second memory portion.

23. The non-volatile memory according to claim 21, wherein said at least one first and second memory portions are selected independently from one another, and each memory portion has a respective access mode.

24. The non-volatile memory according to claim 21, further comprising protocol and operating management procedures that are the same for said at least one first and second memory portions while tolerating different propagation times therein.

25. The nonvolatile memory according to claim 21, further comprising read, program and erase circuitry for said at least one memory matrix; and wherein said at least one second memory portion is placed immediately adjacent said read, program and erase circuitry as compared to placement of said at least one first memory portion.

26. The non-volatile memory according to claim 21, wherein said at least one memory matrix is configured so that the memory is a Flash LEPROM memory with a NAND architecture; and wherein said at least one said second memory portion operates with access times that are comparable to a memory with a NOR architecture.

27. The non-volatile memory according to claim 21, further comprising read, program and erase circuitry for said at least one memory matrix; wherein each read, program and erase operation conducted on said at least one second memory portion corresponds to a deactivation of said at least one switch; and wherein each read, program and erase operation conducted on said at least one first memory portion corresponds to an activation of said at least one switch.

28. The nan-volatile memory according to claim 21, wherein a read current for memory cells in said at least one second memory portion is higher than a read current for memory cells in said at least one first memory portion.

29. A method for reading a non-volatile memory comprising a semiconductor substrate, at least one memory matrix on the semiconductor substrate and comprising a plurality of memory cells organized in rows and columns, a plurality of word lines coupled to the rows of the plurality of memory cells, a plurality of bit lines coupled to the columns of the plurality of memory cells, the method comprising:

dividing the at least one memory matrix into at least one first memory portion and at least one second memory portion, the first and second memory portions having different access speeds and sharing the plurality of bit lines; and operating at least one switch between the at least one first and second memory portions for electrically interrupting the plurality of bit lines being shared for selecting the at least one first or second memory portion.

30. A method according to claim 29, wherein the memory further comprises read, program and erase circuitry for the at least one memory matrix; and wherein only the at least one second memory portion is coupled to the read, program and erase circuitry when the at least one switch is deactivated.

31. A method according to claim 29, further comprising read, program and erase circuitry for said at least one memory matrix; wherein each read, program and erase operation conducted on the at least one second memory portion corresponds to a deactivation of the at least one switch; and wherein each read, program and erase operation conducted on the at least one first memory portion corresponds to an activation of the at least one switch.

32. A method according to claim 29, wherein a read current for memory cells in the at least one second memory portion is higher than a read current for memory cells in the at least one first memory portion.

33. A method according to claim 29, wherein the at least one memory matrix is configured so that the memory is a Flash EEPROM memory with a NAND architecture.

* * * * *

UNITED STATES PATENT AND TRADEMARK OFFICE
CERTIFICATE OF CORRECTION

PATENT NO. : 7,274,594 B2
APPLICATION NO. : 11/279378
DATED : September 25, 2007
INVENTOR(S) : Pascucci et al.

It is certified that error appears in the above-identified patent and that said Letters Patent is hereby corrected as shown below:

Column 6, Lines 7-8
Delete: "indicates"
Insert: -- indicated --

Column 7, Line 54
Delete: "Bil"
Insert: -- Bit --

Column 10, Line 57
Delete: "signficant"
Insert: -- significant --

Column 13, Line 5
Delete: "DSL (1))"
Insert: -- DSL (1) --

Column 13, Line 36
Delete: "structure"
Insert: -- structures --

Column 13, Line 47
Delete: "SSL. Witch"
Insert: -- SSL, which --

Column 14, Line 33
Delete: "WL"
Insert: -- Wl --

Column 14, Line 36
Delete: "(1  v)"
Insert: -- (18v) --

Column 15, Line 41
Delete: "an"
Insert: -- a --

Column 19, Line 28
Delete: "exhausts"
Insert: -- exhaust --

Column 21, Line 48
Delete: "Witch "
Insert: -- which --

Column 23, Line 36
Delete: "claim 1"
Insert: -- claim 8 --

UNITED STATES PATENT AND TRADEMARK OFFICE
CERTIFICATE OF CORRECTION

PATENT NO. : 7,274,594 B2
APPLICATION NO. : 11/279378
DATED : September 25, 2007
INVENTOR(S) : Pascucci et al.

It is certified that error appears in the above-identified patent and that said Letters Patent is hereby corrected as shown below:

| | |
|---|---|
| Column 23, Line 57 | Delete: "portion cells"<br>Insert: -- portion -- |
| Column 24, Line 54 | Delete: "nonvolatile"<br>Insert: -- non-volatile -- |
| Column 24, Line 62 | Delete: "LEPROM"<br>Insert: -- EEPROM -- |
| Column 25, Line 8 | Delete: "nan-volatile"<br>Insert: -- non-volatile -- |

Signed and Sealed this

Third Day of June, 2008

JON W. DUDAS
*Director of the United States Patent and Trademark Office*